United States Patent
Matsumoto et al.

(10) Patent No.: US 10,444,620 B2
(45) Date of Patent: Oct. 15, 2019

(54) MASK BLANK, PHASE-SHIFT MASK AND METHOD FOR MANUFACTURING SEMICONDUCTOR DEVICE

(71) Applicant: HOYA CORPORATION, Shinjuku-ku, Tokyo (JP)

(72) Inventors: Atsushi Matsumoto, Tokyo (JP); Hiroaki Shishido, Tokyo (JP); Takashi Uchida, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 101 days.

(21) Appl. No.: 15/897,330

(22) Filed: Feb. 15, 2018

(65) Prior Publication Data

US 2018/0180987 A1    Jun. 28, 2018

Related U.S. Application Data

(62) Division of application No. 15/121,124, filed as application No. PCT/JP2014/082500 on Dec. 9, 2014, now Pat. No. 9,933,698.

(30) Foreign Application Priority Data

Mar. 18, 2014    (JP) .................. 2014-055099

(51) Int. Cl.
G03F 1/32 (2012.01)
G03F 1/58 (2012.01)
G03F 7/20 (2006.01)

(52) U.S. Cl.
CPC .................. *G03F 1/32* (2013.01); *G03F 1/58* (2013.01); *G03F 7/2053* (2013.01)

(58) Field of Classification Search
CPC ............. G03F 1/32; G03F 1/58; G03F 7/2053
USPC .......................................................... 430/5
See application file for complete search history.

(56) References Cited

U.S. PATENT DOCUMENTS

| | | | |
|---|---|---|---|
| 6,045,954 | A | 4/2000 | Dai et al. |
| 2004/0072016 | A1 | 4/2004 | Okazaki et al. |
| 2007/0212618 | A1 | 9/2007 | Yoshikawa et al. |
| 2007/0248897 | A1 | 10/2007 | Yoshikawa et al. |
| 2009/0246647 | A1 | 10/2009 | Hashimoto et al. |
| 2011/0217635 | A1 | 9/2011 | Hashimoto et al. |
| 2012/0064438 | A1 | 3/2012 | Yoshikawa et al. |
| 2013/0071777 | A1 | 3/2013 | Nozawa et al. |
| 2013/0130159 | A1 | 5/2013 | Yoshikawa et al. |
| 2013/0280644 | A1 | 10/2013 | Lin et al. |
| 2015/0198873 | A1 | 7/2015 | Okubo et al. |

FOREIGN PATENT DOCUMENTS

| | | |
|---|---|---|
| JP | 08220731 A | 8/1996 |
| JP | 2004-133029 A | 4/2004 |
| JP | 2004-318076 A | 11/2004 |
| JP | 2007-241065 A | 9/2007 |
| JP | 2007-241135 A | 9/2007 |
| JP | 2009-244752 A | 10/2009 |
| JP | 2010-217514 A | 9/2010 |
| JP | 2011-102969 A | 5/2011 |
| JP | 2012-53120 A | 3/2012 |
| JP | 2012-58593 A | 3/2012 |
| JP | 2013-109136 A | 6/2013 |
| KR | 10-2004-0090401 A | 10/2004 |
| WO | 2011-125337 A | 10/2011 |
| WO | 2014/010408 A1 | 1/2014 |

OTHER PUBLICATIONS

International Search Report for PCT/JP2014/082500 dated Mar. 17, 2015.
Communication dated Oct. 4, 2016 from the Korean Intellectual Property Office in counterpart Application No. 10-2016-7021196.
Communication dated Oct. 22, 2019, from Japanese Patent Office in counterpart application No. 2015-193354.
Japanese Patent Application No. 2015-193354, Notice of Reasons for Refusal dated Jun. 26, 2019.

*Primary Examiner* — Christopher G Young

(74) *Attorney, Agent, or Firm* — Kilpatrick Townsend & Stockton LLP

(57) ABSTRACT

To provide a phase-shift mask in which the reduction in thickness of a light-shielding film is provided when a transition metal silicide-based material is used for the light-shielding film and by which the problem of ArF light fastness can be solved; and a mask blank for manufacturing the phase-shift mask.

A mask blank has a structure in which a phase-shift film, an etching stopper film, a light-shielding film, and a hard mask film are laminated in said order on a transparent substrate, and at least one layer in the light-shielding film is made of a material which contains transition metal and silicon, and satisfies the conditions of Formula (1) below:

$$C_N \leq 9.0 \times 10^{-6} \times R_M^4 - 1.65 \times 10^{-4} \times R_M^3 - 7.718 \times 10^{-2} \times R_M^2 + 3.611 \times R_M - 21.084 \quad \text{Formula (1)}$$

wherein $R_M$ is a ratio of the content of transition metal to the total content of transition metal and silicon in said one layer, and $C_N$ is the content of nitrogen in said one layer.

16 Claims, 5 Drawing Sheets

MASK BLANK, PHASE-SHIFT MASK AND METHOD FOR MANUFACTURING SEMICONDUCTOR DEVICE

CROSS REFERENCE TO RELATED APPLICATIONS

This is a Divisional of application Ser. No. 15/121,124 filed Aug. 24, 2016, claiming priority based on International Application No. PCT/JP2014/082500 filed Dec. 9, 2014, claiming priority based on Japanese Patent Application No. 2014-055099 filed Mar. 18, 2014, the contents of all of which are incorporated herein by reference in their entirety.

TECHNICAL FIELD

The present invention relates to a mask blank, a phase-shift mask, and a method for manufacturing a semiconductor device.

BACKGROUND ART

In a manufacturing process of a semiconductor device, a fine pattern is generally formed using a photolithographic method. In the formation of the fine pattern, multiple substrates, which are referred to as transfer masks, are usually used. The transfer mask is formed by providing the fine pattern comprised of a metal thin film, etc. on a generally transparent glass substrate. The photolithographic method is also used in the manufacture of the transfer mask.

Refinement of a pattern for the semiconductor device requires the refinement of a mask pattern formed in the transfer mask as well as shortening of a wavelength of an exposure light source used in photolithography. Nowadays, the exposure light sources used in the manufacture of semiconductor devices are shifting from KrF excimer lasers (wavelength: 248 nm) to ArF excimer lasers (wavelength: 193 nm), that is, shorter wavelength light sources are increasingly used.

The known types of transfer masks include a binary mask including a light-shielding film pattern made of a chromium-based material on a conventional transparent substrate, as well as a half tone phase-shift mask. The half tone phase-shift mask comprises a phase-shift film pattern on the transparent substrate. The phase-shift film has functions for allowing transmission of light at an intensity not substantially contributing to the light exposure and for providing the light transmitted through the phase-shift film with a predetermined phase difference with respect to light traveling the same distance through air, thereby generating a so-called phase-shift effect.

Generally, in the transfer mask, a periphery region outside the region in which a transfer pattern is formed should ensure optical density (OD) not less than a predetermined value such that, upon the exposure transfer to a resist film on a semiconductor wafer using an exposure apparatus, the resist film will not be affected by the exposure light transmitted through the periphery region. Usually, in the periphery region of the transfer mask, OD is desirably 3 or more, and at least about 2.7 of OD is required. However, the phase-shift film of the half tone phase-shift mask has a function for allowing the transmission of the exposure light at a predetermined transmittance, and thus, it is difficult to ensure the optical density required for the periphery region of the transfer mask by this phase-shift film alone. Therefore, a light-shielding film (light blocking film) is laminated onto a semitransparent film having predetermined phase-shift amount and transmittance with respect to the exposure light, so that a laminated structure of the semitransparent film and light-shielding film ensures the predetermined optical density.

On the other hand, the use of a transition metal silicide-based material for the light-shielding film to increase the accuracy in formation of a fine pattern in the light-shielding film has been considered in recent years. Patent Document 1 discloses the relevant technique.

However, it has been recently ascertained that a MoSi-based (transition metal silicide-based) film, when irradiated with ArF excimer laser exposure light (ArF exposure light) for a long time, causes a phenomenon of pattern line width variation, which is also regarded as a problem in Patent Documents 2 and 3, etc. Regarding this problem, Patent Document 2 discloses that the formation of a passive film on a surface of a pattern formed of a MoSi-based film improves light fastness to the ArF exposure light (ArF light fastness), and Patent Document 3 discloses the technique to improve the ArF light fastness by providing the constitution in which a transition metal silicon-based material film such as a half tone phase-shift film has the oxygen content of 3 at % or more, and has the silicone content and transition metal content within a range satisfying a predetermined relational expression, and in which a surface oxide layer is provided on a surface layer of the transition metal silicon-based material film.

PRIOR ART DOCUMENTS

Patent Documents

Patent Document 1: Japanese Patent Application Publication 2007-241065
Patent Document 2: Japanese Patent Application Publication 2010-217514
Patent Document 3: Japanese Patent Application Publication 2012-058593

SUMMARY OF THE INVENTION

Problems to be Solved by the Invention

Patent Document 1 describes the use of a transition metal silicide-based material for a phase-shift film or light-shielding film. However, as for a material used for the phase-shift film and light-shielding film, Patent Document 1 does not take the viewpoint of ArF light fastness into consideration. In Patent Document 2, although the ArF light fastness is improved by forming a passive film on a surface of a pattern formed of a MoSi-based film, this approach does not change an inner structure of the MoSi-based film. That is, the inner structure of the MoSi-based film has the ArF light fastness equivalent to a conventional one. Thus, a passive film should be formed not only on a surface layer of an upper surface in the pattern of the MoSi-based film, but also on surface layers of side walls. In Patent Document 2, while a passive film is formed by performing plasma treatment, UV irradiation treatment, or heat treatment after forming the pattern in the MoSi-based film, the pattern formed in the MoSi-based film has a large difference in density in a plane, and the distance between side walls of adjacent patterns is often extremely different. Therefore, there is a problem that it is not easy to form passive films all having the same thickness on the side walls of all the patterns.

On the other hand, Patent Document 3 shows one solution for the ArF light fastness in using the transition metal silicide-based material film. As for the transition metal silicide-based material, it has been confirmed by the experiment by the applicant that the ArF light fastness tends to be obtained by increasing the nitrogen content (FIG. 2 illustrated in the Embodiments section). That is, by using the transition metal silicide-based material film having the nitrogen content equal to or greater than a predetermined amount for the phase-shift film or light-shielding film of the half tone phase-shift mask, it can be expected to possess the ArF light fastness while increasing the accuracy in the formation of a fine pattern.

Patent Document 3 describes a mask blank having a structure in which a half tone phase-shift film and a light-shielding film are laminated in said order on a transparent substrate. In Patent Document 3, the half tone phase-shift film is made of a transition metal silicon-based material which is comprised of a material containing transition metal, silicon, oxygen, and nitrogen, and the material composition applied is regarded as having high ArF light fastness in Patent Document 3. Patent Document 3 discloses that the film made of the transition metal silicon-based material regarded as having high ArF light fastness is used as a light-shielding film (laminated on the half tone phase-shift film). As for the other materials used for the light-shielding film laminated on the half tone phase-shift film, it only describes a material containing chromium (chromium-based material), which has been conventionally and broadly used. That is, Patent Document 3 only discloses that the light-shielding film is made of a material having the high ArF light fastness.

Formation of the light-shielding film to be provided on the half tone phase-shift film (hereinafter also simply referred to as "phase-shift film") from the chromium-based material is the simplest approach since the ArF light fastness does not have to be taken into account. However, in view of the necessity to form a fine pattern in the light-shielding film, the chromium-based material is not necessarily a preferable material. In the half tone phase-shift mask (hereinafter also simply referred to as "phase-shift mask"), a transfer pattern including the fine pattern is provided in the phase-shift film. The light-shielding film is provided with a relatively sparse pattern such as a light-shielding band. The mask blank used for manufacturing the phase-shift mask generally has a structure in which a phase-shift film and a light-shielding film are laminated from the transparent substrate side.

In the process for manufacturing the phase-shift mask from the mask blank, the transfer pattern to be formed in the phase-shift film should be first formed in the light-shielding film by dry etching, such that the light-shielding film with the transfer pattern formed therein is used as an etching mask to form the transfer pattern in the phase-shift film by the dry etching. Since the fine pattern is temporarily formed in the light-shielding film, a material which can form the fine pattern with high accuracy is desirably used for the light-shielding film.

The light-shielding film made of the chromium-based material should be patterned by the dry etching with a mixed gas of a chlorine-based gas and an oxygen gas. In the dry etching with the mixed gas of the chlorine-based gas and oxygen gas, it is difficult to increase the tendency of anisotropic etching due to characteristics of the etching gas. Thus, it is not easy to increase the shape accuracy of pattern side walls, and it is also not easy to reduce CD accuracy variation in a plane (planar view). The accuracy of the transfer pattern formed in this light-shielding film affects the accuracy of the transfer pattern in the phase-shift film formed by dry etching the phase-shift film.

A resist film made of an organic material tends to be vulnerable to oxygen plasma. In order to form a pattern in the light-shielding film made of the chromium-based material by the dry etching using the resist film as an etching mask, a thickness of the resist film should be increased. Since the film thickness sufficient to ensure the predetermined optical density is necessary due to the characteristics of the light-shielding film, the thickness of the resist film should be correspondingly increased. When the thickness of the resist film is increased, and the fine pattern is formed in the resist film, a pattern aspect ratio (a ratio of width to height of the pattern) becomes high, and the resist pattern is liable to collapse, which is unfavorable for the formation of the fine pattern. In view of the above, under the existing circumstances, there are limitations in increasing the accuracy when forming the fine pattern in the light-shielding film made of the chromium-based material.

If the light-shielding film is made of the transition metal silicide-based material, the light-shielding film is patterned by the dry etching with a fluorine-based gas. Since the dry etching with the fluorine-based gas has a high tendency toward the anisotropic etching, it may increase the shape accuracy of pattern side walls. As disclosed in Patent Document 1, an etching mask used in patterning the light-shielding film is often an etching mask film made of the chromium-based material, not the resist film made of the organic material. Further, since both the phase-shift film and light-shielding film are made of the transition metal silicide-based material, an etching stopper film made of the chromium-based material is often provided between the phase-shift film and light-shielding film.

In addition, while not considered in Patent Document 1, in the manufacture of a phase-shift mask from the mask blank having such a laminated structure, if a mark such as an alignment mark outside the region where the transfer pattern is formed is comprised of the laminated structure of the light-shielding film and phase-shift film (an alignment mark pattern is formed in the light-shielding film and phase-shift film such that the mark is identified by the contrast between the portion of the laminated structure of the light-shielding film and phase-shift film and the portion where the transparent substrate is exposed), the etching mask film should remain after the completion of the dry etching for forming the transfer pattern in the etching stopper film, as described below.

Thus, the thickness and composition of the etching mask film and etching stopper film should be designed such that the etching time required for the dry etching for forming a pattern in the etching mask film is longer than the etching time required for the dry etching for forming the pattern in the etching stopper film. In any of the design approaches, the thickness of the resist film tends to be increased compared to the film design without consideration for the formation of this alignment mark.

If the transfer pattern is formed by dry etching the light-shielding film using the etching mask film as a mask, the etching mask film made of the chromium-based material has etching durability to the fluorine-based gas, but it does not mean that it remains completely unetched. During the patterning of the light-shielding film, since a surface of the etching mask film is continuously exposed to the etching gas with high anisotropy (biased etching gas), it is gradually etched through a physical action, etc. Thus, the thickness of the etching mask film should be determined in view of a reduction amount of film thickness during the dry etching with the fluorine-based gas for the patterning of the light-shielding film, as well as a reduction amount of film thickness during the dry etching with the mixed gas of the chlorine-based gas and oxygen gas for the patterning of the etching stopper film.

When the thickness of the etching mask film is increased, the thickness of the resist film used as a mask in patterning the etching mask film should also be increased. Therefore, there is a need for the etching mask film having a reduced thickness. In order to reduce the thickness of the etching mask film, the thickness of the light-shielding film is desirably reduced. However, the light-shielding film has a restriction that the predetermined optical density (OD) should be ensured. In order to reduce the film thickness while possessing a "light-shielding" ability that is an original function of the light-shielding film, its material should have high optical density (OD) per unit film thickness. In the transition metal silicon-based material, the content of elements other than the transition metal silicide should be decreased in order to increase the optical density (OD) per unit film thickness. In particular, since the elements which cause the reduction in optical density are oxygen and nitrogen, the content of these elements should be decreased. However, from the viewpoint of the ArF light fastness, the nitrogen content should be equal to or greater than the predetermined amount as described above. In this respect, an inevitable trade-off has been considered to exist.

In view of the above, it is an object of the present invention to provide a phase-shift mask in which the reduction in thickness of the light-shielding film is provided even if the transition metal silicide-based material is used to enable the formation of a fine pattern in the light-shielding film and by which the problem of ArF light fastness can be solved; a mask blank for manufacturing the phase-shift mask; and a method for manufacturing a semiconductor device.

Means of Solving the Problems

In order to solve the above problems, the present invention comprises the following configurations.

(Configuration 1)

A mask blank having a structure in which a phase-shift film, an etching stopper film, and a light-shielding film are laminated in said order on a transparent substrate, wherein the etching stopper film is made of a material containing chromium;

wherein the phase-shift film is made of a material in which transition metal, silicon, and nitrogen are contained, and a ratio of the content [atom %] of transition metal to the total content [atom %] of transition metal and silicon is less than 4 [%];

wherein the light-shielding film has a single layer structure, or a laminated structure comprised of multiple layers; and wherein at least one layer in the light-shielding film is made of a material which contains transition metal and silicon, but does not contain nitrogen and oxygen, or a material which contains transition metal, silicon, and nitrogen, and satisfies the conditions of Formula (1) below:

$$C_N \leq 9.0\times10^{-6}\times R_M^4 - 1.65\times10^{-4}\times R_M^3 - 7.718\times10^{-2}\times R_M^2 + 3.611\times R_M - 21.084 \quad \text{Formula (1)}$$

wherein $R_M$ is a ratio [%] of the content [atom %] of transition metal to the total content [atom %] of transition metal and silicon in said one layer, and $C_N$ [atom %] is the content [atom %] of nitrogen in said one layer.

(Configuration 2)

A mask blank having a structure in which a phase-shift film, an etching stopper film, and a light-shielding film are laminated in said order on a transparent substrate, wherein the etching stopper film is made of a material containing chromium;

wherein the phase-shift film is comprised of a surface layer and layers other than the surface layer;

wherein the layers other than the surface layer are made of a material in which transition metal, silicon, and nitrogen are contained, a ratio of the content [atom %] of transition metal to the total content [atom %] of transition metal and silicon is less than 9 [%], and incomplete nitride is a main component;

wherein the light-shielding film has a single layer structure, or a laminated structure comprised of multiple layers; and wherein at least one layer in the light-shielding film is made of a material which contains transition metal and silicon, but does not contain nitrogen and oxygen, or a material which contains transition metal, silicon, and nitrogen, and satisfies the conditions of Formula (1) below:

$$C_N \leq 9.0\times10^{-6}\times R_M^4 - 1.65\times10^{-4}\times R_M^3 - 7.718\times10^2\times R_M^2 + 3.611\times R_M - 21.084 \quad \text{Formula (1)}$$

wherein $R_M$ is a ratio [%] of the content [atom %] of transition metal to the total content [atom %] of transition metal and silicon in said one layer, and $C_N$ [atom %] is the content [atom %] of nitrogen in said one layer.

(Configuration 3)

A mask blank having a structure in which a phase-shift film, an etching stopper film, and a light-shielding film are laminated in said order on a transparent substrate, wherein the etching stopper film is made of a material containing chromium;

wherein the phase-shift film is comprised of a surface layer and layers other than the surface layer;

wherein the layers other than the surface layer are made of a material consisting of silicon and nitrogen, or a material consisting of silicon, nitrogen, and one or more elements selected from metalloid elements, non-metallic elements, and noble gases;

wherein the light-shielding film has a single layer structure, or a laminated structure comprised of multiple layers; and wherein at least one layer in the light-shielding film is made of a material which contains transition metal and silicon, but does not contain nitrogen and oxygen, or a material which contains transition metal, silicon, and nitrogen, and satisfies the conditions of Formula (1) below:

$$C_N \leq 9.0\times10^{-6}\times R_M^4 - 1.65\times10^{-4}\times R_M^3 - 7.718\times10^2\times R_M^2 + 3.611\times R_M - 21.084 \quad \text{Formula (1)}$$

wherein $R_M$ is a ratio [%] of the content [atom %] of transition metal to the total content [atom %] of transition metal and silicon in said one layer, and $C_N$ [atom %] is the content [atom %] of nitrogen in said one layer.

(Configuration 4)

The mask blank according to Configuration 3, wherein the layers other than the surface layer in the phase-shift film have a structure in which a low-transmittance layer and a high-transmittance layer are laminated, and wherein the low-transmittance layer has nitrogen content that is relatively lower than the high-transmittance layer.

(Configuration 5)

The mask blank according to Configuration 3 or 4, wherein the surface layer in the phase-shift film is made of a material consisting of silicon, nitrogen, and oxygen, or a material consisting of silicon, nitrogen, oxygen, and one or more elements selected from metalloid elements, non-metallic elements, and noble gases.

(Configuration 6)

The mask blank according to any one of Configurations 1 to 5, wherein the optical density with respect to ArF excimer laser light is 2.7 or more in the laminated structure of the phase-shift film, etching stopper film, and light-shielding film.

(Configuration 7)

The mask blank according to any one of Configurations 1 to 6, wherein a hard mask film made of a material containing chromium is provided on the light-shielding film.

(Configuration 8)

A phase-shift mask manufactured from the mask blank according to any one of Configurations 1 to 7.

(Configuration 9)

A method for manufacturing a semiconductor device, comprising the step of: setting the phase-shift mask according to Configuration 8 on an exposure apparatus having an exposure light source for emitting ArF excimer laser light, so as to transfer a transfer pattern onto a resist film formed on a transfer target substrate.

Effect of the Invention

According to a mask blank (and a phase-shift mask manufactured therefrom) of the present invention, even if the transition metal silicide-based material is used for the light-shielding film, the thickness of the light-shielding film may be reduced, and it is possible to solve the problem of ArF light fastness. Further, according to a method for manufacturing a semiconductor device of the present invention, even if the phase-shift mask is used for a prolonged period (even if it is irradiated with the ArF excimer laser exposure light for a prolonged period) in the manufacture of the semiconductor device, the occurrence of the phenomenon of pattern line width variation may be restrained.

MODES FOR CARRYING OUT THE INVENTION

Figure 1:
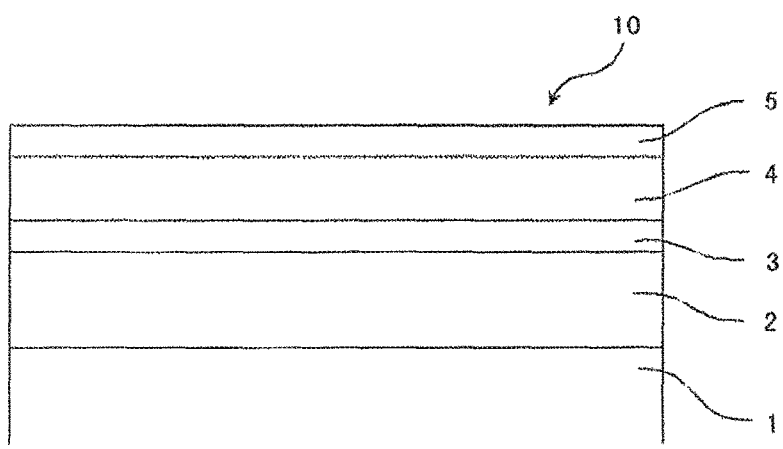
FIG. 1 is a cross-sectional view showing a layered configuration of a mask blank according to Embodiment 1 of the present invention.

Embodiments of the present invention are specifically described below with reference to the drawings. Each of the embodiments below shows merely one configuration for embodying the present invention, and it is not intended to limit the present invention to its extent.

Regarding a phase-shift mask having a structure in which a phase-shift pattern and a light-shielding band pattern are laminated on a transparent substrate in said order from the transparent substrate side, if it is intended to form both a phase-shift film and a light-shielding film from a transition metal silicide-based material, a common design is to apply the transition metal silicide-based material having ArF light fastness to both the phase-shift film and light-shielding film. However, as a result of earnest study by the inventors, it was found that there is no practical problem even if the transition metal silicide-based material regarded as having low ArF light fastness is applied to the light-shielding film.

When a phase-shift mask is set on a mask stage of an exposure apparatus for the exposure transfer to a transfer target object (such as a resist film on a semiconductor wafer), the exposure light is generally incident from a back side (main surface on which a phase-shift pattern is not provided) of the transparent substrate of the phase-shift mask. The exposure light incident on the transparent substrate is then incident on the phase-shift film (phase-shift pattern) from the opposite main surface. The amount of exposure light is decreased during passage through the phase-shift film, such that the amount corresponds to a predetermined transmittance when the light exits from a surface of the phase-shift film. In a region where the light-shielding film exists on the phase-shift film (a region where a light-shielding pattern exists), the exposure light decreased to the light amount corresponding to the predetermined transmittance (if the etching stopper film is interposed between the phase-shift film and the light-shielding film, the exposure light further passed through the etching stopper film) will be incident on the light-shielding film.

The inventors discovered that the pattern line width variation caused by irradiating a thin film pattern made of the transition metal silicide-based material with the ArF exposure light correlates with an accumulated radiation value of the ArF exposure light. As described above, in comparison to a radiation value of the ArF exposure light received by the phase-shift pattern of the phase-shift mask by single exposure transfer to a transfer target object, the radiation value of the ArF exposure light received by the light-shielding pattern is significantly smaller. That is, when the exposure transfer is performed on the phase-shift mask a predetermined number of times, the accumulated radiation value of the ArF exposure light received by the light-shielding pattern is significantly smaller than the accumulated radiation value of the ArF exposure light received by the phase-shift pattern.

Thus, when the exposure transfer to a transfer target object is performed in a phase-shift mask having a structure in which a phase-shift pattern and a light-shielding pattern made of a transition metal silicide-based material with low ArF light fastness are laminated on a transparent substrate, the number of times of use (number of times of exposure transfer to the transfer target object) until the light-shielding pattern line width changes to an unacceptable width is significantly greater than in the case of exposure transfer to the transfer target object performed under the same conditions in a transfer mask comprising a light-shielding pattern without another interposed film on the transparent substrate.

A factor affecting the life of the phase-shift mask is not only the increase in pattern line width relevant to the ArF light fastness. For example, the phase-shift mask must be cleaned with chemicals after it is used a predetermined number of times. During cleaning, a pattern surface of the phase-shift film or light-shielding film dissolves due to the chemicals, though only gradually (reduction of film thickness occurs). When the optical characteristics as the phase-shift film or light-shielding film of the phase-shift mask become unsatisfied due to the reduction of film thickness caused by repeated cleaning, the phase-shift mask reaches its end of life. There are other factors affecting the life of the phase-shift mask (the number of times that it can be used). If the amount of line width variation of the light-shielding film due to the ArF exposure is within an acceptable range until the phase-shift mask reaches its end of life partly determined by these factors, there is no problem with the performance as a light-shielding film.

As a result of the above described earnest study, the inventors found that, in a light-shielding film laminated on the transparent substrate with an interposed phase-shift film that decreases the ArF exposure light to the predetermined transmittance, even if the transition metal silicide-based material is selected without considering the ArF light fastness, the amount of line width variation of the light-shielding film due to the ArF exposure is within the acceptable range at least until the phase-shift film reaches its end of life, and there is substantially no problem with the ArF light fastness. Further, they reached the conclusion that the selection of a material forming the light-shielding film from the viewpoint of a light-shielding performance that is a function originally required for the light-shielding film results in a mask blank in which a fine pattern can be formed in the phase-shift film.

While the actual condition is that when using a transition metal silicide-based material in response to a demand for the formation of a fine pattern in a light-shielding film, an unsolvable trade-off relationship as described above is believed to exist between "a requirement that a material having high optical density per unit film thickness (=as for the transition metal silicide-based material, a material having low content of oxygen and nitrogen) is necessary based on the demand for the thinned thickness and light-shielding performance required for the light-shielding film" and "the recent finding that the high light fastness to the ArF excimer laser exposure light is required (=transition metal silicide containing a predetermined amount or more of nitrogen must be used)", the present invention provides a mask blank in which a material having high optical density per unit film thickness (=transition metal silicide having low content of oxygen and nitrogen) is used for a light-shielding film; a phase-shift mask; and a method for manufacturing a semiconductor device, since the above finding has been derived for the first time by the applicant.

Embodiment 1

FIG. 1 is a cross-sectional view showing a layered configuration of a mask blank 10 according to Embodiment 1 of the present invention. The mask blank 10 of the present invention shown in FIG. 1 has a structure in which a phase-shift film 2, an etching stopper film 3, a light-shielding film 4, and a hard mask film 5 are laminated in said order on a transparent substrate 1.

Respective layers are described below.

<<Transparent Substrate>>

There is no particular limitation on the transparent substrate 1, provided that it is transparent to the ArF excimer laser. In the present invention, a synthetic quartz substrate, and various other glass substrates (e.g., soda lime glass, aluminosilicate glass, etc.) may be used. Among the various glass substrates, the synthetic quartz substrate has particularly high transparency at a wavelength of the ArF excimer lasers or in a shorter wavelength range, and thus, it is suitable as a substrate for the mask blank of the present invention used in forming a high-definition transfer pattern.

<<Phase-Shift Film>>

The phase-shift film 2 allows the transmission of light at an intensity not substantially contributing to the light exposure (e.g., 1% to 30%, preferably 2% to 20%, with respect to the exposure wavelength), and has a predetermined phase difference (e.g., 150 degrees to 180 degrees). Specifically, the phase-shift film 2 is patterned so as to form a portion where the phase-shift film is left and a portion where no phase-shift film is left, such that a phase of light transmitted through the phase-shift film (light at an intensity not substantially contributing to the light exposure) is in a substantially inverted relation with respect to a phase of light transmitted through the portion where no phase-shift film is left (ArF excimer laser exposure light). In this way, the light transmitted through the portion where the phase-shift film is left and the light transmitted through the portion where no phase-shift film is left enter the other's region due to a diffraction phenomenon, thereby annihilating both of them, so that a light intensity at the boundary between the two portions is nearly zero, and a contrast, i.e., a resolution, at the boundary is improved. The thickness of the phase-shift film 2 is preferably 70 nm or less.

If NTD (Negative Tone Development) process is used as an exposure/development process for a resist film on a wafer, a bright field mask (transfer mask with a high pattern opening ratio) is used. In a bright field phase-shift mask, when the transmittance of the phase-shift film is higher, the balance between 0-order light and first order light for the light transmitted through a transparent portion is better, thereby improving a pattern resolution on the resist film. It is because there is a greater effect that the exposure light transmitted through the phase-shift film interferes with the 0-order light to attenuate the light intensity. When the phase-shift film 2 is applied to the bright field phase-shift mask, the transmittance at an exposure wavelength in the phase-shift film 2 is more preferably 10% or more. Also in this case, the transmittance at an exposure wavelength in the phase-shift film 2 is preferably 30% or less, and more preferably 20% or less.

The phase-shift film 2 is made of a material containing transition metal, silicon, and nitrogen. In this case, the transition metal includes one or more metals of molybdenum (Mo), tantalum (Ta), tungsten (W), titanium (Ti), chromium (Cr), hafnium (Hf), nickel (Ni), vanadium (V), zirconium (Zr), ruthenium (Ru), rhodium (Rh), niobium (Nb), indium (In), tin (Sn), and palladium (Pd), etc., or alloys of these metals. In addition to the above elements, the material of the phase-shift film 2 may contain elements such as nitrogen (N), oxygen (O), carbon (C), hydrogen (H), and boron (B). Further, the material of the phase-shift film 2 may contain an inert gas, such as helium (He), argon (Ar), krypton (Kr), and xenon (Xe).

These materials have a high etching rate in the dry etching with an etching gas containing a fluorine-based gas, and thus, help to obtain various properties required for the phase-shift film. In particular, these materials are desirable as materials forming a phase-shift film which should strictly control the phase of the exposure light transmitted through the phase-shift film. In the phase-shift film 2, a percentage [%] calculated by dividing the content [at % (atomic percent)] of transition metal (M) in the film by the total content [atom %] of transition metal (M) and silicon (Si) (hereinafter referred to as M/M+Si ratio) is preferably less than 4 [%]. The M/(M+Si) ratio in the phase-shift film 2 is more preferably 3 [%] or less, and further preferably 2 [%] or less.

The pattern line width variation in the thin film (phase-shift film 2) made of the transition metal silicide-based material which is caused by the irradiation of the ArF exposure light is due to a phenomenon in which an altered layer containing Si and O as well as some amount of transition metal is formed on a surface layer side of the pattern. In the thin film of the transition metal silicide-based material which is formed by the sputtering method, a structural gap is easily formed. Oxygen or water in the atmosphere easily enters the structural gap. When the phase-shift film in such a state is irradiated with the ArF exposure light, ozone is generated from oxygen or water in the thin film. Silicon or transition metal in a thin film receiving the irradiation of the ArF exposure light is excited, such that it couples with ozone to generate oxide of silicon or transition metal. The oxide of transition metal is characterized in that it spreads throughout the thin film so as to be easily deposited on a surface layer. Further, due to the deposition of the oxidized transition metal onto a surface of the thin film, oxygen or water in the atmosphere can more easily enter the thin film, thereby promoting further oxidation of silicon or transition metal in the thin film. That is, when the abundance ratio of transition metal in the thin film is high, the ArF light fastness is easily lowered.

If the M/(M+Si) ratio in the phase-shift film 2 is 4 [%] or more, an altered layer on a pattern surface layer of the phase-shift film 2, which is due to the deposition of transition metal upon irradiation with the ArF exposure light, rapidly grows, and thus, the life of the phase-shift mask resulting therefrom tends to be shorter than the life of the phase-shift mask which is determined by factors other than the factor relevant to the irradiation of the ArF exposure light. The M/(M+Si) ratio set to be less than 4 [%] allows for the ArF light fastness sufficient to be used as the phase-shift mask 20. However, the M/(M+Si) ratio in the phase-shift film 2 is preferably 1 [%] or more. It is because when a phase-shift mask is manufactured from a mask blank, and a black defect present in a pattern in the phase-shift film 2 is corrected by electron beam irradiation and an unexcited gas such as $XeF_2$, the phase-shift film 2 preferably has lower sheet resistance.

A surface layer of the phase-shift film 2 which is adjacent to the etching stopper film 3 preferably contains much oxygen relative to the oxygen content in the phase-shift film 2 other than the surface layer. By configuring the surface layer in this way, when the etching stopper film 3 is removed by the dry etching, the surface layer of the phase-shift film 2 may have high durability to the exposure to an etching gas that is a mixed gas of a chlorine-based gas and an oxygen gas. A method for forming a surface layer in the phase-shift film 2 to have the relatively high oxygen content includes a method for oxidatively treating the surface layer of the phase-shift film 2 after its formation, a method for forming a layer from a material with the high oxygen content on a surface of the phase-shift film 2 by a sputtering method, etc. The oxidation treatment which can be applied includes a heat treatment in a gas containing oxygen (such as in the atmosphere), or a treatment for oxidizing the surface layer by the flash irradiation using, for example, a flash lamp.

<<Etching Stopper Film>>

The etching stopper film 3 is made of a material containing chromium so as to ensure etching selectivity in relation to the light-shielding film 4 and phase-shift film 2 in the dry etching for the patterning to form a transfer pattern. A material for the etching stopper film 3 may contain, in addition to the above-described elements, one or more elements selected from nitrogen (N), oxygen (O), carbon (C), hydrogen (H), and boron (B). Further, in order to improve an etching rate in the dry etching with the chlorine-based gas and oxygen gas, and to enhance durability to the dry etching with the fluorine-based gas, the material for the etching stopper film 3 may contain one or more elements selected from indium (In) and tin (Sn). Moreover, the material for the etching stopper film 3 may contain an inert gas, such as helium (He), argon (Ar), krypton (Kr), and xenon (Xe). Specifically, the material includes, for example, CrN, CrON, CrOC, and CrOCN.

The thickness of the etching stopper film 3 is preferably 3 nm or more, and more preferably 4 nm or more. Also, the thickness of the etching stopper film 3 is preferably 10 nm or less, and more preferably 8 nm or less.

<<Light-Shielding Film>>

As explained above, in most cases, a phase-shift mask manufactured from a mask blank does not include the fine pattern in the light-shielding film 4. However, in order to form the fine pattern in the phase-shift film with great accuracy, it is necessary to enable the fine pattern to be formed in the light-shielding film 4. For at least one layer in the light-shielding film 4, the transition metal silicide-based material is used to enable the formation of the fine pattern, and a material having high optical density per unit film thickness is used for thinning the film. In particular, at least one layer in the light-shielding film 4 is made of a material which contains transition metal and silicon, but does not contain nitrogen and oxygen, or a material which contains transition metal, silicon, and nitrogen, and satisfies the conditions of Formula (1) below:

$$C_N \leq 9.0 \times 10^{-6} \times R_M^4 - 1.65 \times 10^{-4} \times R_M^3 - 7.718 \times 10^{-2} \times R_M^2 + 3.611 \times R_M - 21.084 \quad \text{Formula (1)}$$

wherein $R_M$ is a ratio [%] of the content [atom %] of transition metal to the total content [atom %] of transition metal and silicon in said one layer, and $C_N$ [atom %] is the content [atom %] of nitrogen in said one layer.

While the transition metal includes one or more metals of molybdenum (Mo), tantalum (Ta), tungsten (W), titanium (Ti), chromium (Cr), hafnium (Hf), nickel (Ni), vanadium (V), zirconium (Zr), ruthenium (Ru), rhodium (Rh), niobium (Nb), indium (In), tin (Sn), and palladium (Pd), etc., or alloys of these metals, molybdenum is especially preferable. A material for the light-shielding film 4 may contain, in addition to the above transition metal and silicon, elements such as nitrogen (N), oxygen (O), carbon (C), hydrogen (H), and boron (B). However, the oxygen content should be 5 at % or less, preferably 3 at % or less, and it is further preferable that oxygen is not positively contained (the result of a composition analysis, such as RBS or XPS, is not more than a detection lower limit). Further, the material for the light-shielding film 4 may contain the inert gas such as helium (He), argon (Ar), krypton (Kr), and xenon (Xe).

The light-shielding film 4 is comprised of a single layer structure, or a laminated structure having two or more layers. The single layer structure allows for the thinnest light-shielding film 4. Thus, if thinning of the light-shielding film 4 is further pursued, it is preferable that the light-shielding film 4 is configured to have the single layer structure, and that the light-shielding film 4 is entirely made of the material which contains transition metal and silicon, but does not contain nitrogen and oxygen, or the material which contains transition metal, silicon, and nitrogen, and satisfies the conditions of Formula (1) above.

In addition to the condition that the light-shielding film 4 satisfies the predetermined optical density with respect to the ArF exposure light, the condition on a surface reflectance of the light-shielding film with respect to the ArF exposure light (e.g., 40% or less, preferably 30% or less) is often imposed on the light-shielding film 4. In such a case, the light-shielding film preferably includes a structure in which an upper layer and a lower layer are laminated in said order from the side farthest from the transparent substrate. In particular, the lower layer is made of a material with high optical density, that is, the material which contains transition metal and silicon, but does not contain nitrogen and oxygen, or the material which contains transition metal, silicon, and nitrogen, and satisfies the conditions of Formula (1) above. Further, the upper layer is made of a material with relatively low optical density so as to have a function for decreasing the surface reflectance. Also, the light-shielding film 4 may be formed as a compositional gradient film so as to have an inner structure comprised of a region made of the above described material with high optical density and a region made of the above described material with relatively low optical density.

While the upper layer may be made of a material other than the transition metal silicide-based material, it is preferably made of a material which contains transition metal, silicon, and nitrogen. In this case, the total content of nitrogen and oxygen in the upper layer is desirably 30 at % or more. In view of the thinning of the entire light-shielding film, the total content of nitrogen and oxygen in the upper layer is preferably 60 at % or less. Since the degree of decrease in extinction coefficient in relation to the content in the upper layer is higher for oxygen than nitrogen, and oxygen may further enhance the exposure light permeability in the upper layer, oxygen can further decrease the surface reflectance. The oxygen content in the upper layer is preferably 10 at % or more, and more preferably 15 at % or more. On the other hand, the nitrogen content in the layer is desirably 10 at % or more. However, in order to decrease the surface reflectance while slightly restraining the oxygen content in the upper layer for the thinning of the light-shielding film, the nitrogen content is preferably 15 at % or more, and more preferably 20 at % or more.

When the upper layer is made of the transition metal silicide-based material, the transition metal content in the upper layer is preferably less than 10 at %. If the transition metal content in the upper layer is 10 at % or more, the phase-shift mask manufactured from this mask blank has low resistance to mask cleaning (alkaline cleaning with an ammonia hydrogen peroxide mixture, etc., or cleaning with warm water), which may lead to the change in optical properties (increase in surface reflectance) due to the dissolution of the upper layer. This trend is especially remarkable when molybdenum is used as the transition metal for the upper layer.

Figure 2:
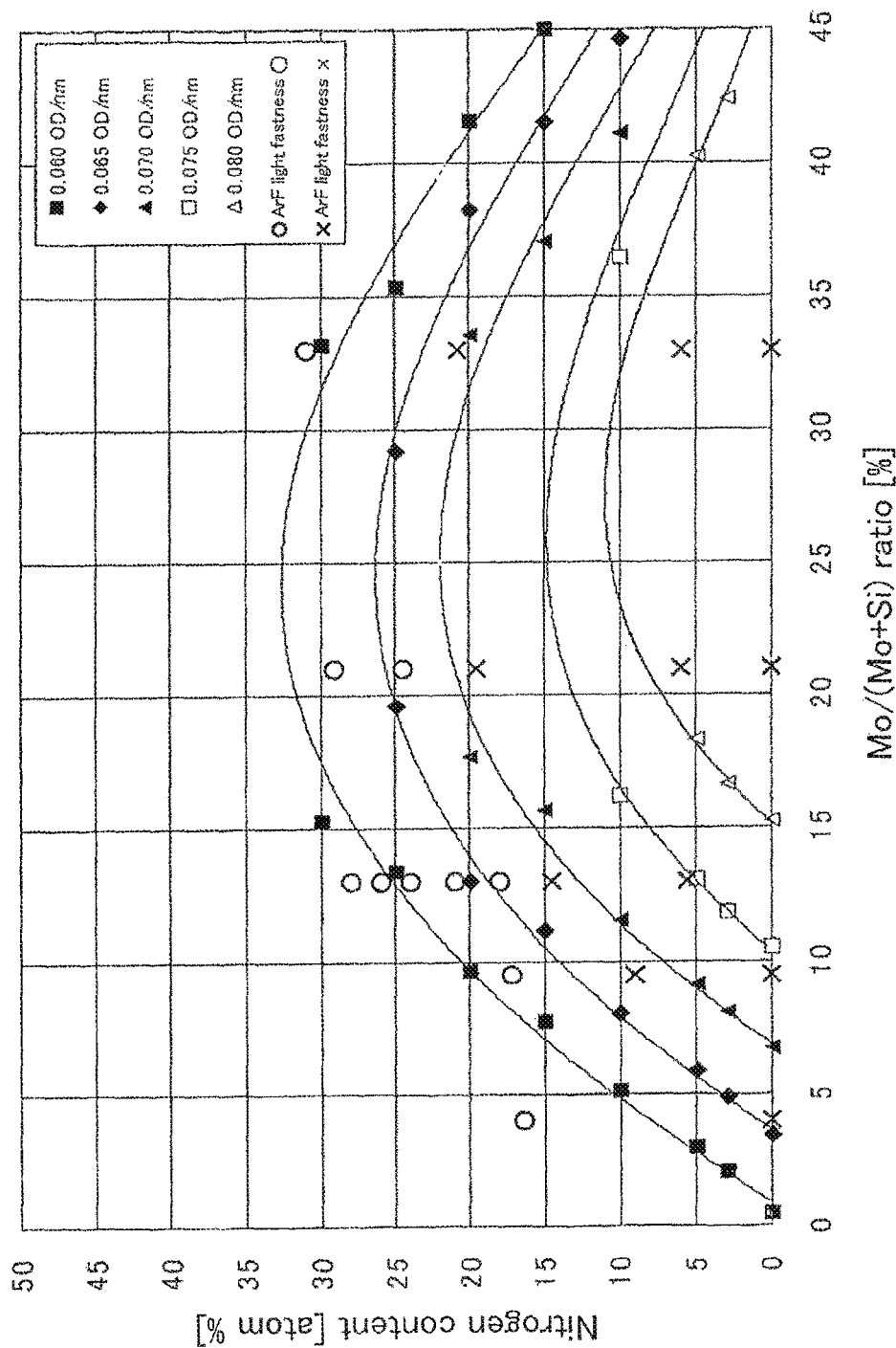
FIG. 2 is a graph showing the relationship between Mo/(Mo+Si) ratio and nitrogen content in each transition metal silicide-based material in which optical density per unit film thickness is a predetermined value (in a range of 0.060 [OD/nm] to 0.080 [OD/nm] in increments of 0.005).

FIG. 2 is a graph for light-shielding films having respective predetermined optical density (OD) values per unit film thickness (1 nm) (in a range from 0.060 [OD/nm] to 0.080 [OD/nm] in increments of 0.005), in which, for each thin film containing molybdenum, silicon, and nitrogen, the horizontal axis shows a ratio obtained by dividing the content [atom %] of molybdenum by the total content [atom %] of molybdenum and silicon (i.e., the ratio of molybdenum content [atom %] represented as a percentage [%], assuming that the total content [atom %] of molybdenum and silicon in the light-shielding film is 100: hereinafter referred to as Mo/(Mo+Si) ratio), while the vertical axis shows the nitrogen content, and approximate curves for respective films are drawn.

In FIG. 2, the results of verification of the light fastness to the ArF excimer laser exposure light in the thin films each having different Mo/(Mo+Si) ratios and nitrogen contents are also plotted using symbols ○ and ×. The ArF light fastness was verified using a test mask prepared by forming a thin film from the transition metal silicide-based material on a transparent substrate and forming a line-and-space pattern with a pattern width (line width) of 200 [nm] in the thin film. The ArF excimer laser as the exposure light was irradiated to pass through the thin film from the transparent substrate side of the test mask. The ArF excimer laser was irradiated intermittently, which is the condition close to the actual exposure by an exposure apparatus.

The specific conditions of the ArF excimer laser irradiation were as follows: emission frequency: 500 [Hz]; energy density per pulse: 10 [mJ/(cm$^2$·pulse)]; the number of pulses sequentially emitted: 10; time required to sequentially emit 10 pulses: 20 [msec]; pulse width: 5 [nsec]; idle period after sequential emission (interval period): 500 [msec]. Under these irradiation conditions, intermittent irradiation was performed for 15 hours. An accumulated exposure amount for the thin film intermittently irradiated is 10 [kJ/cm$^2$]. During the ArF excimer laser irradiation, the test mask was placed in the atmosphere at a relative humidity of 35%RH.

Before and after the irradiation under the above conditions, the pattern width (line width) of the thin film of the test mask was measured to calculate an amount of change in line width before and after the ArF excimer laser irradiation. The thin film of the test mask, in which the amount of change in line width was 10 [nm] or more, was regarded as having no ArF light fastness, and plotted in FIG. 2 by putting the symbol "×" at a location corresponding to the Mo/(Mo+Si) ratio and nitrogen content in the thin film. Similarly, the thin film of the test mask, in which the amount of change in line width was less than 10 [nm], was regarded as having ArF light fastness, and plotted in FIG. 2 by putting the symbol "○" at a location corresponding to the Mo/(Mo+Si) ratio and nitrogen content in the thin film.

As is clear from the plot with ○ and × in FIG. 2, it was found that a thin film made of a molybdenum silicide-based material should contain nitrogen in an amount not less than a predetermined value in order to have the ArF light fastness. It was also found that the lower limit of nitrogen content in the presence or absence of ArF light fastness changes depending on the Mo/(Mo+Si) ratio. Further, while the verification results for the ArF light fastness or a trend of optical density per unit film thickness in FIG. 2 relate to the thin film made of the molybdenum silicide-based material, it was also found that a similar trend is observed in transition metal silicide-based materials other than the molybdenum silicide-based material (even if the horizontal axis in FIG. 2 shows the M/(M+Si) ratio, nearly similar results are obtained).

In the graph of FIG. 2, an approximation formula for an approximate curve based on plots at which the optical density per unit film thickness is 0.070 [OD/nm] (plots "▲" in FIG. 2) is Formula (1). The light-shielding film 4 may be thinned by using a material falling within the lower region including the approximate curve of Formula (1) in FIG. 2 (the side where the nitrogen content is low). As is clear from the ArF light fastness plots using ○ and × in FIG. 2, the lower region including the approximate curve of Formula (1) has difficulty in ArF light fastness. As described above, when it is intended to provide "a phase-shift mask having ArF light fastness (and a mask blank for manufacturing it)", a material falling within the region would not be conventionally selected.

When further thinning of the light-shielding film 4 is intended, a ratio $R_M$ [%] of the content [atom %] of transition metal to the total content [atom %] of transition metal and silicon, and the nitrogen content $C_N$ [atom %] in the light-shielding film 4 preferably fall within a lower region including an approximate curve based on plots for 0.075 [OD/nm] in FIG. 2 (plots "□" in FIG. 2). The approximate curve in this case is defined by Formula (2) below:

$$C_N \leq 9.84 \times 10^{-4} \times R_M^3 - 1.232 \times 10^{-1} \times R_M^2 + 4.393 \times R_M - 33.413 \quad \text{Formula (2)}$$

Further, the ratio $R_M$ [%] of the content [atom %] of transition metal to the total content [atom %] of transition metal and silicon, and the nitrogen content $C_N$ [atom %] in the light-shielding film 4 preferably fall within a lower region including an approximate curve based on plots for 0.080 [OD/nm] in FIG. 2 (plots "A" in FIG. 2). The approximate curve in this case is defined by Formula (3) below:

$$C_N \leq 1.355 \times 10^{-3} \times R_M^3 - 1.668 \times 10^{-1} \times R_M^2 + 6.097 \times R_M - 58.784 \quad \text{Formula (3)}$$

Since the approximation formulae, Formula (1) to Formula (3), are calculated based on respective plots in FIG. 2, they fluctuate with calculation methods. However, a shift in borders defined based on "M/(M+Si) ratio" and "nitrogen content" satisfying the predetermined optical density, which is caused due to the fluctuation in approximation formulae, has a low impact on the optical density variation, which is acceptable.

The entire thickness of the light-shielding film 4 is preferably 50 nm or less, and more preferably 45 nm or less. Also, the entire thickness of the light-shielding film 4 is preferably 20 nm or more, and more preferably 25 nm or more. If the light-shielding film 4 is configured to have a structure in which an upper layer and a lower layer are laminated in said order from the side farthest from the transparent substrate, the thickness of the upper layer is preferably 3 nm or more, and more preferably 4 nm or more. Also, the thickness of the upper layer is preferably 10 nm or less, and more preferably 8 nm or less. In order for the upper layer to have a function for decreasing the reflectance of the light-shielding film 4 with respect to the ArF exposure light, and in order to restrain the reflectance variation in a plane, the thickness of the upper layer must be 3 nm or more. The excessively thickened upper layer is not preferable because the entire thickness of the light-shielding film 4 inevitably becomes thick.

<<Hard Mask Film>>

A material containing chromium is used for the hard mask film 5 so as to ensure the etching selectivity in relation to the light-shielding film 4 in the dry etching for the patterning to form the transfer pattern in the light-shielding film 4. The material for the hard mask film 5 may contain, in addition to the above described elements, one or more elements selected from nitrogen (N), oxygen (O), carbon (C), hydrogen (H), and boron (B). Further, in order to improve the etching rate in the dry etching with the chlorine-based gas and oxygen gas, and to enhance durability to the dry etching with the fluorine-based gas, the material for the hard mask film 5 may contain one or more elements selected from indium (In) and tin (Sn). Moreover, the material for the hard mask film 5 may contain an inert gas, such as helium (He), argon (Ar), krypton (Kr), and xenon (Xe). Specifically, the material includes, for example, CrN, CrON, CrOC, and CrOCN.

The thickness of the hard mask film 5 is preferably 3 nm or more, and more preferably 5 nm or more. If the thickness of the hard mask film 5 is less than 3 nm, the reduction in film thickness of the hard mask film 5 is progressed in a pattern edge direction before completing the dry etching of the light-shielding film 4 using a hard mask film pattern as a mask, and thus, CD accuracy of the pattern transferred to the light-shielding film 4 relative to a design pattern may be significantly decreased. Also, the thickness of the hard mask film 5 is preferably 15 nm or less, and more preferably 12 nm or less. If the thickness is greater than 15 nm, the thickness of the resist film required for transferring the design pattern to the hard mask film 5 is increased, and thus, it becomes difficult to accurately transfer the fine pattern to the hard mask film 5.

Both the etching stopper film 3 and hard mask film 5 are made of the material containing chromium, and are patterned by the dry etching using a mixed gas of oxygen and chlorine. As illustrated in steps for manufacturing a phase-shift mask from the mask blank of Embodiment 1 below, even after completing the dry etching for forming the transfer pattern (phase-shift pattern) in the etching stopper film 3, the hard mask film 5 should remain on the light-shielding film 4. Therefore, when a thickness of the etching stopper film 3 is Ds, an etching rate of the etching stopper film 3 with respect to the mixed gas of oxygen and chlorine is Vs, a thickness of the hard mask film 5 is Dh, and an etching rate of the hard mask film 5 with respect to the mixed gas of oxygen and chlorine is Vh, the relationship: (Dh/Vh)>(Ds/Vs) is desirably satisfied.

After patterning the etching stopper film 3, the hard mask film 5 having the thickness of 2 nm or more is preferably left, such that the hard mask film 5 surely remains regardless of the etching conditions until the dry etching of the phase-shift film 2 with the fluorine-based gas is completed. From this viewpoint, the relationship: Dh−2·Ds·(Vh/Vs)≥2 [nm] is desirably satisfied as well.

In order to configure the etching stopper film 3 and hard mask film 5 to satisfy the above described conditions, the best way for preparation is to make the etching stopper film 3 and hard mask film 5 from materials having substantially the same composition so that the hard mask film 5 is thicker than the etching stopper film 3 (preferably, by 2 nm or more). Another method is to select the material for forming the hard mask film 5 which has a lower etching rate with respect to the mixed gas of oxygen and chlorine than the material for forming the etching stopper film 3. In order to increase the etching rate of the chromium-based material film with respect to the mixed gas of oxygen and chlorine, the increase in content of oxygen or nitrogen in the material is effective. However, this preparation method has an aspect for decreasing the etching durability to the fluorine-based gas.

If the content of indium (In) or tin (Sn) in the chromium-based material film is increased, the etching rate of the chromium-based material film with respect to the mixed gas of chlorine may be increased, though this is not so remarkable as the increase in etching rate due to the increase in content of oxygen or nitrogen. Furthermore, there is an advantage that the etching durability with respect to the fluorine-based gas is only slightly decreased due to the increase in content of indium (In) or tin (Sn) in the chromium-based material film.

Respective layers in the mask blank 10 of Embodiment 1 are described above. In the laminated structure, which is comprised of the phase-shift film 2, etching stopper film 3, and light-shielding film 4, in the mask blank according to the present invention, optical density (OD) with respect to the ArF excimer laser light (wavelength: 193 nm) should be 2.7 or more, and is preferably 3.0 or more. In view of functions required of respective films in the above laminated structure (laminated film), the light-shielding film 4 desirably has higher optical density. In accordance with the present embodiment, since the material having high optical density per unit film thickness is used as described above, the film thickness may be thinned. In considering the phase-shift mask, the etching stopper film 3 may be functionally regarded as a part of the light-shielding film 4 (the light-shielding film is recognized as having a laminated structure comprised of a plurality of layers), as is clear from the above.

Even if the phase-shift film 2 of the present embodiment is configured to have an optical property of transmittance (10% or more) suitable for the bright field phase-shift mask, the optical density with respect to the exposure light should still be 2.7 or more, and is preferably 3.0 or more, in the laminated structure of the phase-shift film 2, etching stopper film 3, and light-shielding film 4. In this case, since higher optical density is required of the light-shielding film 4, the effect obtained by applying the configuration of the light-shielding film 4 of the present embodiment becomes greater.

Next, the method for manufacturing a phase-shift mask using the mask blank 10 of the present embodiment described above is explained. FIGS. 3(a) to 3(h) are cross-sectional views showing a manufacturing process of a phase-shift mask according to Embodiment 1 of the present invention. The method for manufacturing the phase-shift mask according to Embodiment 1 is described in accordance with the manufacturing process shown in FIGS. 3(a) to 3(h). The configuration of the mask blank 10 (FIG. 3(a)) used here is as stated above.

First, a first resist film 6 made of an organic material is formed on the hard mask film 5 of the mask blank 10 (FIG. 1). Next, a desired pattern (transfer pattern) to be formed in the phase-shift film 2 is drawn with an electron beam on the first resist film 6 formed on the mask blank 10. After the electron beam drawing, a development process is conducted, thereby forming a first resist pattern 6a having the desired transfer pattern (FIG. 3(a)). Then, the dry etching with the mixed gas of the chlorine-based gas and oxygen gas using the first resist pattern 6a having the transfer pattern as a mask is performed to form a hard mask film pattern 5a having the transfer pattern (FIG. 3(b)). The chlorine-based gas used for the mixed gas of the chlorine-based gas and oxygen gas may include, for example, $Cl_2$, $SiCl_4$, $CHCl_3$, $CH_2Cl_2$, $CCl_4$, and $BCl_3$, etc. After forming the hard mask film pattern 5a, the remaining first resist pattern 6a is removed.

Figure 3A:
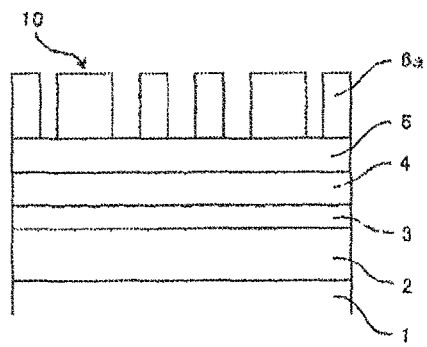
FIGS. 3(a) to 3(h) are cross-sectional views showing a manufacturing process of a phase-shift mask according to Embodiment 1 of the present invention.
Figure 3B:
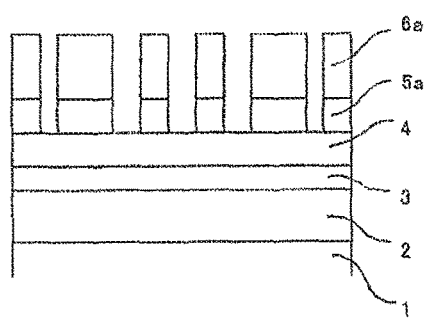
Figure 3C:
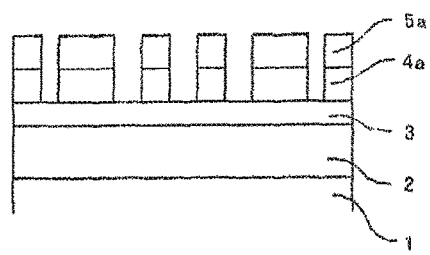

Next, the dry etching with the fluorine-based gas using the hard mask film pattern 5a as a mask is performed to form a light-shielding film pattern 4a having the transfer pattern (FIG. 3(c)). The fluorine-based gas used here may include $SF_6$, $CHF_3$, $CF_4$, $C_2F_6$, $C_4F_8$, etc.

Figure 3D:
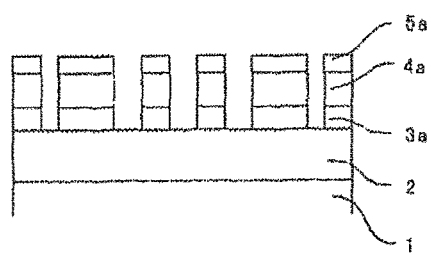

Then, the dry etching with the mixed gas of the chlorine-based gas and oxygen gas using the light-shielding film pattern 4a as a mask is performed to form an etching stopper film pattern 3a having the transfer pattern (FIG. 3(d)). Since the hard mask film pattern 5a is also etched during the etching for forming the etching stopper film pattern 3a, the hard mask film 5 should have been configured to prevent the hard mask film pattern 5a from disappearing at this stage.

Subsequently, a second resist film 7 is formed on the hard mask film pattern 5a, and a desired light-shielding pattern including a light-shielding band to be formed in the light-shielding film 4 is drawn with an electron beam on the second resist film 7. After the electron beam drawing, a development process is conducted, thereby forming a second resist pattern 7b having the light-shielding pattern. Then, the dry etching with the mixed gas of the chlorine-based gas and oxygen gas using the second resist pattern 7b having the light-shielding pattern as a mask is performed to form a hard mask film pattern 5b having the light-shielding pattern (FIG. 3(e)).

Figure 3E:
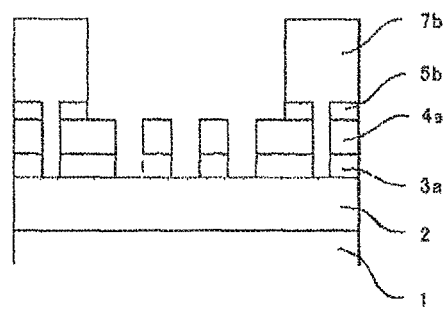
Figure 3F:
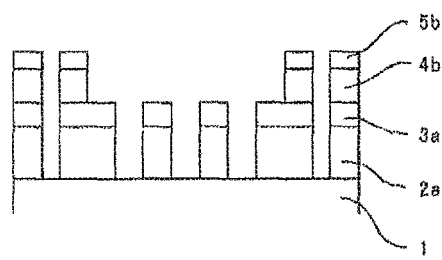

Then, the remaining second resist pattern 7b is removed, and the dry etching with the fluorine-based gas using as a mask the hard mask film pattern 5b having the light-shielding pattern and the etching stopper film pattern 3a having the transfer pattern is performed, such that a light-shielding film pattern 4b having the light-shielding pattern and a phase-shift film pattern 2a having the transfer pattern are formed in one step (FIG. 3(f)).

Figure 3G:
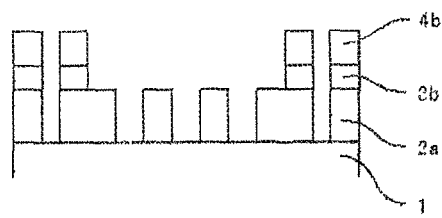

Subsequently, the dry etching with the mixed gas of the chlorine-based gas and oxygen gas using the light-shielding film pattern 4b as a mask is performed to form an etching stopper film pattern 3b having the light-shielding pattern and to remove the hard mask film pattern 5b (in one step, (FIG. 3(g))). After that, the predetermined cleaning is conducted, such that a phase-shift mask 20 is obtained (FIG. 3(h)).

Figure 3H:
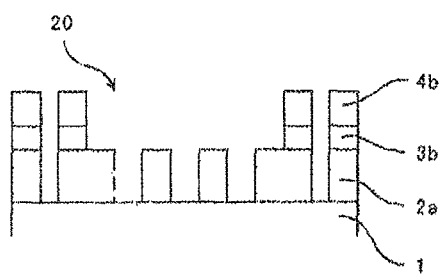

The phase-shift mask comprises an alignment mark, which is formed in a periphery region outside the area in which the transfer pattern is formed, and which is used in alignment upon setting the phase-shift film on the exposure apparatus (FIG. 3(h)). This alignment mark desirably has a high contrast, and an alignment mark pattern should have been formed also in the phase-shift film 2 (that is, a laminated structure portion of the phase-shift film 2, etching stopper film 3, and light-shielding film 4, and a portion where a surface of the substrate 1 is exposed constitute the alignment mark). In order to form such an alignment mark, the hard mask film 5 should remain upon completing the dry etching with the mixed gas of the chlorine-based gas and oxygen gas for forming the fine pattern in the etching stopper film 3 (FIG. 3(d)). However, as the thickness of the hard mask film 5 is increased, the thickness of the resist film 6 should also be increased, and thus, the increase in thickness of the hard mask film 5 without limitation is not acceptable. If the light-shielding film 4 having the predetermined optical density can be formed to have a thinner thickness, the reduction amount of thickness of the hard mask film 5 may be reduced upon dry etching the light-shielding film 4 with the fluorine-based gas. Also, from such a viewpoint, the thinned thickness of the light-shielding film is a very important factor, and according to the present invention, the mask blank in conformity with such requirements may be provided.

In the manufacturing process in FIGS. 3(a) to 3(h), the remaining first resist pattern 6a is removed after forming the hard mask film pattern 5a. However, the remaining first resist pattern 6a may be left as it is. In such a case, the first resist pattern 6a is left until the process for forming the light-shielding film pattern 4a and etching stopper film pattern 3a. The first resist pattern 6a only has to be left on the hard mask film pattern 5a at least until the middle of the dry etching for forming the etching stopper film pattern 3a. In performing such a process, the hard mask film pattern 5a is protected by the first resist pattern 6a at least until the middle of the dry etching for forming the etching stopper film pattern 3a, and while it is protected, it is not etched with the etching gas comprised of the chlorine-based gas and oxygen gas. Thus, in this case, the hard mask film 5 and etching stopper film 3 do not have to satisfy the relationship: (Dh/Vh)>(Ds/Vs).

<Method for Manufacturing a Semiconductor Device>

The phase-shift mask of the present embodiment described above is used to form a pattern on a semiconductor substrate based on the transfer pattern of the phase-shift mask by lithography technology, and then various other steps are performed, such that it is possible to manufacture a semiconductor device comprising various patterns, etc. formed on the semiconductor substrate.

The exposure apparatus comprises an exposure light source for the ArF excimer laser exposure light, a projection optical system, a mask stage on which a transfer mask (phase-shift mask) is placed, a stage on which a semiconductor substrate is placed, etc. The exposure apparatus equipped with a phase-shift mask 20 of the present embodiment and comprising the semiconductor substrate having a resist film installed on the stage causes the exposure light obtained from the exposure light source for the ArF excimer laser exposure light to be appropriately incident on the phase-shift mask 20 through the optical system, such that the light transmitted through the phase-shift mask 20 (transfer pattern) causes the transfer onto the semiconductor substrate having a resist film through the projection optical system (the transfer pattern is transferred to the resist film formed on a transfer target substrate). By performing the etching, etc. using this resist pattern as a mask, for example, a predetermined wiring pattern may be formed on the semiconductor substrate. The semiconductor device is manufactured through these steps and the other necessary steps. The phase-shift mask 20 of the present embodiment is configured in view of the ArF light fastness, and thus, even if the phase-shift mask 20 is used for a long period of time (even if it is irradiated with the ArF excimer laser exposure light for a long period of time), the amount of pattern line width variation is restrained within an acceptable range.

Embodiment 2

The mask blank of Embodiment 2 according to the present invention is described below. The mask blank of Embodiment 2 has a configuration similar to the mask blank 10 of Embodiment 1 except that the configuration of the phase-shift film is different from the mask blank 10 of Embodiment 1. The components similar to Embodiment 1 are given the same reference numerals as Embodiment 1, and their explanations may be either omitted or simplified. Therefore, the phase-shift film of the mask blank of Embodiment 2 is mainly described below.

<<Phase-Shift Film>>

The phase-shift film 2 of Embodiment 2 is comprised of a surface layer and layers other than the surface layer.

The layers other than the surface layer in the phase-shift film 2 are made by a material, in which transition metal, silicon, and nitrogen are contained; a M/(M+Si) ratio, that is a ratio of the content [atom %] of transition metal to the total content [atom %] of transition metal (M) and silicon (Si), is below 9 [%]; and incomplete nitride is contained as a main component. In this case, the transition metal includes one or more metals of molybdenum (Mo), tantalum (Ta), tungsten (W), titanium (Ti), chromium (Cr), hafnium (Hf), nickel (Ni), vanadium (V), zirconium (Zr), ruthenium (Ru), rhodium (Rh), niobium (Nb), indium (In), tin (Sn), palladium (Pd), etc., or alloys of these metals. In addition to the above elements, the material of the phase-shift film 2 may contain elements such as nitrogen (N), oxygen (O), carbon (C), hydrogen (H), and boron (B). Further, the material of the phase-shift film 2 may contain an inert gas, such as helium (He), argon (Ar), krypton (Kr), and xenon (Xe).

In the present invention, incomplete nitride is a compound which has low nitrogen content with respect to the stoichiometric composition according to the valence that a transition metal element or silicon element can have. That is, it has a few M—N bonds and Si—N bonds. In the present invention, the incomplete nitride may be defined as a compound which has fewer M—N bonds and Si—N bonds than the complete nitride.

For example, when a light semitransmissive film containing transition metal, silicon, and nitrogen as main components is formed on the transparent substrate by the sputtering in an atmosphere containing nitrogen, as a flow rate of the nitrogen gas increases, the nitrogen content in the film also increases (the transmittance increases), but an amount of increase in transmittance relative to the amount of increase in flow rate of the nitrogen gas gradually decreases, which leads to the state in which the nitrogen content in the film does not increase (the transmittance does not increase) even if the flow rate of the nitrogen gas is increased. In the present invention, this state is referred to as complete nitride. Also, the state before the complete nitride state, that is, the state as above in which the nitrogen content in the film may increase (the transmittance may increase) if the flow rate of the nitrogen gas is increased, is referred to as incomplete nitride. The incomplete nitride is included in the state as above in which the increase in transmittance relative to the increase in flow rate of the nitrogen gas is gradually diminished. The incomplete nitride does not include a state that comes before the above described state in which the increase in transmittance relative to the increase in flow rate of the nitrogen gas is gradually diminished.

For example, when the transition metal is molybdenum, bonding states in relation to the flow rate of the nitrogen gas are as follows. That is, if the nitrogen flow rate is zero (0 sccm) (in the case of MoSi film), the main bonding states in the film are Si—Si bonds and Mo—Si bonds. Since many Si—Si bonds are included, it is believed that Si oxidation will affect the light fastness. If the nitrogen flow rate is less than 35 sccm (a ratio of the $N_2$ flow rate to the total flow rate of Ar and $N_2$ [$N_2/(Ar+N_2)$] is less than 77%) for less nitriding, main bonding states in the film are Si—Si bonds, Si—N bonds, and Mo—Si bonds. Since many Si—Si bonds are included, it is believed that Si oxidation will affect the light fastness.

If the nitrogen flow rate is not less than 35 sccm and not more than 50 sccm ([$N_2/(Ar+N_2)$] is not less than 77% and not more than 83%), main bonding states in the film are Si—N bonds and Mo—Si bonds. Since there are few Si—Si bonds and Mo—N bonds, Si and Mo are hardly oxidized. Specifically, since the film includes a relatively larger number of Mo—Si bonds than Mo—N bonds, and the number of Mo—N bonds is relatively small compared to the situation where the film includes a relatively larger number of Mo—N bonds than Mo—Si bonds, it is believed that the effect by Mo oxidation (i.e., decrease in light fastness) will be small.

In the case of a complete nitride film with the nitrogen flow rate being greater than 50 sccm ([$N_2/(Ar+N_2)$] being greater than 83%), the main bonding states in the film are Si—N bonds and Mo—N bonds. Since Mo—N bonds are included, Mo is oxidized. Specifically, since the film includes a relatively larger number of Mo—N bonds than Mo—Si bonds, and the number of Mo—N bonds is relatively large compared to the situation where the film includes a relatively larger number of Mo—Si bonds than Mo—N bonds, it is believed that the effect by Mo oxidation (i.e., decrease in light fastness) will be large.

If the M/(M+Si) ratio in the layers other than the surface layer in the phase-shift film 2 is less than 9%, the above described effects are obtained. On the other hand, as the M/(M+Si) ratio becomes high, the above described effects may not be exhibited. Further, from the viewpoint that the Mo content in the film is further reduced and Mo—N bonds are further decreased (the light fastness is further improved), the M/(M+Si) ratio is preferably less than 7%, or less than 5%.

The transmittance of the phase-shift film 2 at a wavelength of the above described exposure light is preferably not less than 4% and below 9%. If the transmittance is greater than 9%, it is difficult to achieve the incomplete nitride state, and thus, it is also difficult to obtain the above described effects. In particular, the transmittance greater than 9% leads to the complete nitride state even if the nitrogen gas flow rate is reduced to about zero (therefore, the incomplete nitride state cannot be achieved). The more preferable range for transmittance is 8% or less. If the transmittance is less than 4%, the film thickness is increased. The transmittance here refers to the transmittance after film formation without annealing, etc. Therefore, when annealing for stress reduction, etc., the film must be formed in expectation of variation in transmittance due to the annealing. The phase-shift film 2 is preferably prepared such that the phase difference between the ArF exposure light transmitted therethrough and the light traveling through air for the same distance as the thickness of the phase-shift film 2 is within a range of 150 to 180 degrees.

The incomplete nitride film includes Mo—N bonds and Mo—Si bonds, and preferably includes a relatively larger number of Mo—Si bonds than Mo—N bonds. It is preferable because the film includes, as bonding states, a relatively larger number of Mo—Si bonds than Mo—N bonds, and thus Si and Mo are less oxidized, and the light fastness becomes high. Further, the incomplete nitride film preferably mainly includes Si—N bonds and Mo—Si bonds. It is preferable because when the main bonding states in the film are Si—N bonds and Mo—Si bonds, there is almost no Si—Si bond and Mo—N bond, and thus, Si and Mo are less oxidized, and the light fastness becomes high. The main bonding state in the film relates to portions other than the surface layer portion where an oxidized layer, etc. is formed by annealing, etc.

The nitrogen content in the layers other than the surface layer in the phase-shift film 2 is preferably not less than 40 at % and not more than 47 at %. While there may be an effect from the Mo content or transmittance in the film, it becomes difficult to achieve the incomplete nitride state if the nitrogen content in the phase-shift film 2 is greater than 47 at %. If the nitrogen content in the phase-shift film 2 is less than 40 at %, Si—Si bonds increase, such that the light fastness tends to be deteriorated. Further, the nitrogen content in the layers other than the surface layer in the phase-shift film 2 is preferably less than the nitrogen content in the complete nitride film by not less than 2 at % and not more than 20 at %. If the nitrogen content in the layers other than the surface layer in the phase-shift film 2 is lower than the nitrogen content in the complete nitride by less than 2 at %, it becomes difficult to achieve the incomplete nitride state. If the nitrogen content in the layers other than the surface layer in the phase-shift film 2 is lower than the nitrogen content in the complete nitride by more than 20 at %, Si—S bonds increase, and the light fastness tends to be deteriorated.

The steps for manufacturing a phase-shift mask from the mask blank 10 of the present embodiment and the method for manufacturing a semiconductor device using the phase-shift mask are similar to those of Embodiment 1, and thus, their explanations are omitted here.

Embodiment 3

The mask blank of Embodiment 3 according to the present invention is described now. The mask blank of Embodiment 3 has a configuration similar to the mask blank 10 of Embodiment 1 except that the configuration of the phase-shift film is different from the mask blank 10 of Embodiment 1. The components similar to Embodiment 1 are given the same reference numerals as Embodiment 1, and their explanations may be either omitted or simplified. Therefore, the phase-shift film of the mask blank of Embodiment 3 is mainly described below.

<<Phase-Shift Film>>

The phase-shift film 2 of Embodiment 3 is comprised of a surface layer and layers other than the surface layer, and characterized in that the layers other than the surface layer are made of a material consisting of silicon and nitrogen, or a material consisting of silicon, nitrogen, and one or more elements selected from metalloid elements, non-metallic elements, and noble gases (these materials are referred to as silicon-based materials below). As mentioned above, the ArF exposure light irradiation causes an altered layer to be formed on a surface layer of the phase-shift film pattern made of the transition metal silicide-based material. A factor promoting growth of the altered layer is the presence of transition metal. In the phase-shift film of Embodiment 3, since a silicon-based material which does not contain such a factor, transition metal, is applied, the ArF light fastness is enhanced. The phase-shift film except for the inevitably oxidized surface layer (oxidized layer) may be a single layer structure or a laminated structure comprised of a plurality of layers.

Figure 4:
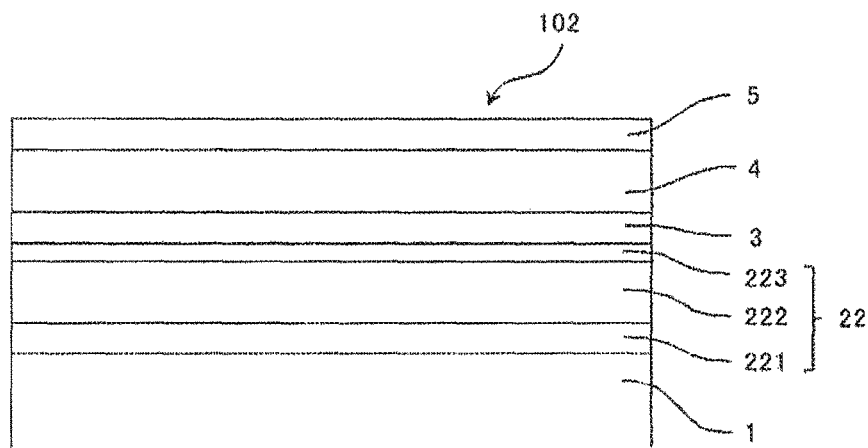
FIG. 4 is a cross-sectional view showing a layered configuration of a mask blank according to a variant of Embodiment 3 of the present invention.

It is possible to form, from a single layer film (including the oxidized layer as the surface layer) made of the silicon-based material, a phase-shift film with optical properties so as to allow for the transmission at a predetermined transmittance and a predetermined phase difference with respect to the ArF exposure light. However, if the phase-shift film is made of a material having such optical properties by the sputtering method, some methods used may result in the film formation conditions under which it is difficult to stably form a film with high uniformity in optical properties or a film with a low defect rate. The phase-shift film 22 having a laminated structure shown in FIG. 4 may solve the problem of the film-forming stability. FIG. 4 is a cross-sectional view showing a layered configuration of a mask blank 102 according to a variant of Embodiment 3. As shown in FIG. 4, the phase-shift film 22 in this variant comprises a low-transmittance layer 221, a high-transmittance layer 222, and an uppermost layer 223.

The inventors did an earnest study on a measure for forming a film which has high uniformity in optical properties or composition in a film thickness direction and a low defect rate when the phase-shift film is comprised of a silicon-based material film containing silicon and nitrogen but no transition metal. In order to form on a substrate the silicon-based material film containing silicon and nitrogen but no transition metal by the current film forming technique so as to have high uniformity in optical properties or composition, the technique for film formation by reactive sputtering must be applied. However, formation of thin film by reactive sputtering may often cause a phenomenon in which a film forming rate or voltage for the thin film vary depending on a mixing ratio of the reactive gas in a film forming chamber.

Figure 5:
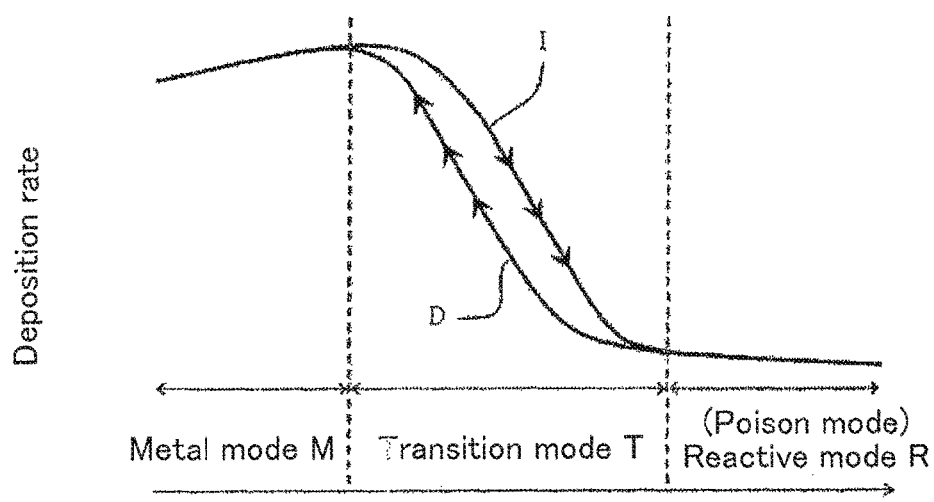
FIG. 5 is a schematic view for illustrating film formation modes when a thin film is formed by reactive sputtering.

FIG. 5 is a graph schematically showing a general trend of change in deposition rate, which is found when a thin film is formed by the reactive sputtering and a mixing ratio of a reactive gas in a mixed gas of a noble gas and the reactive gas in a film forming chamber (or a flow ratio of the reactive gas in the mixed gas) is changed. FIG. 5 shows a curve I which shows a change in deposition rate when the mixing ratio of the reactive gas in the mixed gas is gradually increased (increase mode), and a curve D which shows a change in deposition rate when the mixing ratio of the reactive gas in the mixed gas is gradually decreased (decrease mode). Generally, in an area where the mixing ratio of the reactive gas in the mixed gas is low (area of metal mode M in FIG. 5) and an area where the mixing ratio of the reactive gas in the mixed gas is high (area of reactive mode R in FIG. 5), both the increase and decrease modes have a small fluctuation range for the deposition rate associated with the change in mixing ratio of the reactive gas in the mixed gas. Also, the difference in deposition rate between the increase and decrease modes is small at the same mixing ratio of the reactive gas in the mixed gas. Thus, the thin film may be stably formed in the areas of metal mode M and reactive mode R. That is, the areas of metal mode M and reactive mode R enable formation of thin film having high uniformity in composition and optical properties and a low defect rate.

On the other hand, in an area of transition mode T between the areas of metal mode M and reactive mode R in FIG. 5, a fluctuation range for the deposition rate associated with the change in mixing ratio of the reactive gas in the mixed gas is large, both in the increase and decrease modes. Also, the difference in deposition rate between the increase and decrease modes is large at the same mixing ratio of the reactive gas in the mixed gas. In the area of transition mode T, the deposition rate greatly fluctuates due to a slight change in mixing ratio of the reactive gas in the mixed gas in the film forming chamber, and the slight change in mixing ratio causes the fluctuation in deposition rate due to a shift from the increase mode to decrease mode. Therefore, the thin film is formed while the deposition rate is unstable. The fluctuation in deposition rate affects an amount of component of the reactive gas contained in the thin film. That is, in the area of transition mode T, it is difficult to form a thin film which has high uniformity in composition and optical properties and a low defect rate.

If a phase-shift film having a single layer structure which is comprised of the silicon-based material film containing no transition metal is formed by the reactive sputtering, it is highly necessary to form the film in the area of transition mode T in view of restrictions on required optical properties. There is a method to find a combined reactive gas which provides a small difference in deposition rate between the increase and decrease modes in the transition mode T at the same mixing ratio of the reactive gas in the mixed gas. However, even if such a combined reactive gas is found, there is still a problem of large fluctuation range in the deposition rate associated with the change in mixing ratio of the reactive gas in the mixed gas within the area of transition mode T.

If the silicon-based material film containing silicon and nitrogen but no transition metal is formed by the reactive sputtering in the area of metal mode, so as to try to ensure the film thickness for obtaining a phase difference required of a phase-shift film, an extinction coefficient k for the material of the formed film is high, and thus, the transmittance to ArF exposure light is lower than the required transmittance. Such a film is difficult to cause a phase-shift effect, and thus, it is not suitable for the phase-shift film. On the other hand, if the silicon-based material film containing silicon and nitrogen but no transition metal is formed by the reactive sputtering in the area of reactive mode, so as to try to ensure the film thickness for obtaining a phase difference required of a phase-shift film, an extinction coefficient k for the material of the formed film is low, and thus, the transmittance to ArF exposure light is higher than the required transmittance. With such a film, the phase-shift effect can be obtained, but the resist film on the semiconductor wafer may be exposed to the light transmitted from a pattern portion other than the area where the phase-shift effect is caused, and thus, it is also not suitable for the phase-shift film.

After the earnest study on a means for solving many technical problems which arise in achievement of the phase-shift film suitable for the ArF exposure light by the silicon-based material film containing silicon and nitrogen but no transition metal, the inventors reached the conclusion that the above technical problems can be solved by the phase-shift film having a laminated structure of a low-transmittance layer that is a silicon-based material film formed by reactive sputtering in the area of metal mode and a high-transmittance layer that is a silicon-based material film formed by reactive sputtering in the area of reactive mode.

That is, as shown in FIG. 4, the phase-shift film 22 of the present embodiment includes a structure in which a low-transmittance layer 221 and a high-transmittance layer 222 are laminated; the low-transmittance layer 221 and high-transmittance layer 222 are made of a material consisting of silicon and nitrogen, or a material consisting of silicon, nitrogen, and one or more elements selected from metalloid elements, non-metallic elements, and noble gases; and the low-transmittance layer 221 is formed to have a relatively lower nitrogen content than the high-transmittance layer 222.

The low-transmittance layer 221 and high-transmittance layer 222 in the phase-shift film 22 of the present embodiment are formed by a low-transmittance layer forming step and a high-transmittance layer forming step, respectively. In the low-transmittance layer forming step, a silicon target, or a target made of a material consisting of silicon and one or more elements selected from metalloid elements and non-metallic elements is used to perform the reactive sputtering in a sputtering gas comprising the nitrogen-based gas and noble gas so as to form the low-transmittance layer 221 on the transparent substrate 1. In the high-transmittance layer forming step, a silicon target, or a target made of a material consisting of, in addition to silicon, one or more elements selected from metalloid elements and non-metallic elements is used to perform the reactive sputtering in a sputtering gas comprising the nitrogen-based gas and noble gas and having a higher mixing ratio of the nitrogen-based gas than the step for forming the low-transmittance layer 221, so as to form the high-transmittance layer 222.

The sputtering gas used in the low-transmittance layer forming step is selected such that the mixing ratio of the nitrogen-based gas is lower than a mixing ratio range which causes the transition mode with a tendency of unstable film formation. The sputtering gas used in the high-transmittance layer forming step is selected such that the mixing ratio of the nitrogen gas is higher than the mixing ratio range which causes the transition mode.

In the present embodiment, the phase-shift film 22 is not a single layer structure, but a laminated structure of the low-transmittance layer 221 and high-transmittance layer 222. By forming such a laminated structure, the low-transmittance layer 221 may be formed by the reactive sputtering in the area of metal mode in which a film having low nitrogen content tends to be formed; and the high-transmittance layer 222 may be formed by the reactive sputtering in the area of reactive mode in which a film having high nitrogen content tends to be formed. Thus, both the low-transmittance layer 221 and high-transmittance layer 222 may be formed by the reactive sputtering under the film forming conditions which have small variation in film forming rate or voltage upon the film formation. As a result, it is possible to form the phase-shift film having high uniformity in composition and optical properties and a low defect rate.

The low-transmittance layer 221 and high-transmittance layer 222 are made of a material consisting of silicon and nitrogen, or a material consisting of silicon, nitrogen, and one or more elements selected from metalloid elements, non-metallic elements, and noble gases. The low-transmittance layer 221 and high-transmittance layer 222 do not contain transition metal, which can be a factor for lowering the light fastness to the ArF exposure light (that is, the phase-shift film 22 of the present embodiment has the ArF light fastness). Further, the low-transmittance layer 221 and high-transmittance layer 222 desirably do not contain metallic elements other than transition metal, since it is undeniable that they may become a factor for lowering the light fastness to ArF exposure light. The low-transmittance layer 221 and high-transmittance layer 222 may contain any of metalloid elements, in addition to silicon. They preferably contain one or more elements selected from boron, germanium, antimony, and tellurium among the metalloid elements, since the increase in conductivity of silicon used as a sputtering target may be expected.

The low-transmittance layer 221 and high-transmittance layer 222 may contain any of non-metallic elements, in addition to nitrogen. They preferably contain one or more elements selected from carbon, fluorine, and hydrogen among the non-metallic elements. The low-transmittance layer 221 and high-transmittance layer 222 preferably have oxygen content of 10 at % or less, and more preferably 5 at % or less. Further preferably, they do not positively contain oxygen (the result of the composition analysis, such as RBS or XPS, is not more than the detection lower limit). If the silicon-based material film contains oxygen, the extinction coefficient k tends to significantly decrease, which increases the entire thickness of the phase-shift film. The transparent substrate is generally made of a material containing $SiO_2$ such as synthetic quartz glass as a main component. If one of the low-transmittance layer 221 and high-transmittance layer 222 is formed in contact with a surface of the transparent substrate, and the silicon-based material film contains oxygen, the difference in composition between the silicon-based material film containing oxygen and the glass is small, which may cause the problem that the etching selectivity between the silicon-based material film and transparent substrate 1 is difficult to obtain in the dry etching for forming a pattern in the phase-shift film 22.

A target made of a material which consisting of silicon and one or more elements selected from metalloid elements and non-metallic elements preferably contains one or more elements selected from boron, germanium, antimony, and tellurium as metalloid elements. Since these metalloid elements are expected to enhance conductivity of the target, the target desirably contains these metalloid elements especially when the low-transmittance layer 221 and high-transmittance layer 222 are formed by the DC sputtering method.

The low-transmittance layer 221 and high-transmittance layer 222 may contain a noble gas. The noble gas is an element which exists in the film forming chamber during forming the thin film by reactive sputtering, thereby increasing the deposition rate and improving productivity. The noble gas is turned into plasma and collides with the target, and thus, the target constituent element jumps out of the target, and is laminated onto the transparent substrate 1 while incorporating the reactive gas, such that the thin film is formed. Between the jumping of the target constituent element out of the target and its adhesion to the transparent substrate 1, the noble gas within the film forming chamber is slightly incorporated. The preferable noble gas required in the reactive sputtering includes argon, krypton, and xenon. Further, in order to relieve the stress in the thin film, helium or neon with a small atomic weight may be positively incorporated in the thin film.

In the low-transmittance layer forming step for forming the low-transmittance layer 221 and the high-transmittance layer forming step for forming the high-transmittance layer 222 for the phase-shift film 22, the nitrogen-based gas is contained in the sputtering gas. Any gases containing nitrogen may be applicable as the nitrogen-based gas. As stated above, since the low-transmittance layer 221 and high-transmittance layer 222 preferably have low oxygen content, the nitrogen-based gas containing no oxygen is preferably applied, and the nitrogen gas ($N_2$ gas) is more preferably applied.

The low-transmittance layer 221 and high-transmittance layer 222 in the phase-shift film 22 are preferably laminated in direct contact with each other without any film therebetween. Further, in the film structure, it is preferable that the film made of a material containing a metallic element does not contact either the low-transmittance layer 221 or the high-transmittance layer 222. It is because if the heat treatment or irradiation of ArF exposure light is performed while the film containing silicon is in contact with the film containing a metallic element, the metallic element tends to easily diffuse into the film containing silicon.

The low-transmittance layer 221 and high-transmittance layer 222 are preferably comprised of the same constituent element. If one of the low-transmittance layer 221 and high-transmittance layer contains a different constituent element, and the heat treatment or irradiation of ArF exposure light is performed while these layers are laminated in contact with each other, the different constituent element may move to and diffuse into the layer not containing that constituent element. Also, the optical properties of the low-transmittance layer 221 and high-transmittance layer 222 may significantly change compared to the optical properties at the time of formation of the layers. In particular, when the different constituent element is a metalloid element, the low-transmittance layer 221 and high-transmittance layer 222 must be formed using different respective targets.

The low-transmittance layer 221 and high-transmittance layer 222 may be laminated in the phase-shift film 22 in any order from the transparent substrate side. If the low-transmittance layer 221 and high-transmittance layer 222 are laminated in said order from the side of and adjacent to the transparent substrate 1, the low-transmittance layer 221 is a silicon-containing film with low nitrogen content, such that the etching selectivity may be easily achieved in relation to the transparent substrate 1 made of a material containing $SiO_2$ as a main component. While the etching gas used in the dry etching for forming a pattern in the silicon-containing film is generally the fluorine-based gas, a chlorine-based gas is also applicable as an etching gas in the silicon-containing film with low nitrogen content. By using the chlorine-based gas in the dry etching of the low-transmittance layer 221, the etching selectivity in relation to the transparent substrate 1 may be significantly enhanced.

If the high-transmittance layer 222 and low-transmittance layer 221 are laminated in said order from the side of and adjacent to the transparent substrate 1, the high-transmittance layer 222 is a silicon-containing film with high nitrogen content. Thus, if the high-transmittance layer 222 is formed in contact with the transparent substrate 1 made of a material containing $SiO_2$ as a main component, the high adherence may be easily obtained between the surface of the transparent substrate 1 and the high-transmittance layer 222.

The low-transmittance layer 221 and high-transmittance layer 222 in the phase-shift film 22 are preferably laminated in contact with each other without any other film therebetween, since the silicon-containing film preferably does not contact the film made of a material containing a metallic element for the above reason.

When one low-transmittance layer 221 and one high-transmittance layer 222 are considered as one laminated structure, the phase-shift film 22 preferably has two or more laminated structures. One of the low-transmittance layer 221 and high-transmittance layer 222 preferably has a thickness of 20 nm or less. Since the low-transmittance layer 221 and high-transmittance layer 222 are significantly different in required optical properties, there is a large difference in nitrogen content in the film therebetween. Therefore, there is a great difference in etching rate in the dry etching with the fluorine-based gas between the low-transmittance layer 221 and high-transmittance layer 222. If the phase-shift film is comprised of one low-transmittance layer 221 and one high-transmittance layer 222, i.e., a two-layer structure, when the pattern is formed by the dry etching with the fluorine-based gas, a step is easily generated in a pattern cross-section of the phase-shift film after the etching. Assuming that one low-transmittance layer 221 and one high-transmittance layer 222 are considered as one laminated structure, when the phase-shift film is configured to have two or more laminated structures, the thickness of each (one layer) of the low-transmittance layer 221 and high-transmittance layer 222 is thinner than the above described two-layer structure (one laminated structure), and thus, it is possible to reduce the step generated in the pattern cross-section of the phase-shift film after the etching. The thickness of each (one layer) of the low-transmittance layer 221 and high-transmittance layer 222 is limited to 20 nm or less, thereby further controlling the step generated in the pattern cross-section of the phase-shift film after the etching.

The low-transmittance layer 221 in the phase-shift film 22 of the present invention is a silicon-based material film which has low nitrogen content and does not positively contain oxygen. Therefore, it tends to be easily etched with a fluorine-based gas in an unexcited state, such as $XeF_2$, in the correction of EB defect. Thus, the low-transmittance layer 221 is desirably placed such that it is difficult to contact the fluorine-based gas in an unexcited state, such as $XeF_2$. On the other hand, since the high-transmittance layer 222 is a silicon-based material film with high nitrogen content, it is not easily subject to the influence of the fluorine-based gas in an unexcited state, such as $XeF_2$. As stated above, when one low-transmittance layer 221 and one high-transmittance layer 222 are considered as one laminated structure, and the phase-shift film is formed to have two or more laminated structures, the low-transmittance layer 221 may be configured to be sandwiched between two high-transmittance layers 222, or between the transparent substrate 1 and high-transmittance layer 222. Therefore, while the fluorine-based gas in an unexcited state, such as $XeF_2$, may initially contact and etch the low-transmittance layer 221, it then becomes hard to contact the low-transmittance layer 221 (since a surface of a side wall of the low-transmittance layer 221 becomes more complicated than a surface of a side wall of the high-transmittance layer 222, it is hard for the gas to enter the surface of the side wall of the low-transmittance layer 221). Accordingly, with this laminated structure, it is possible to control the etching of the low-transmittance layer 221 with the fluorine-based gas in an unexcited state, such as $XeF_2$. Further, the thickness of each of the low-transmittance layer 221 and high-transmittance layer 222 is limited to 20 nm or less, such that it is possible to further control the etching of the low-transmittance layer 221 with the fluorine-based gas in an unexcited state, such as $XeF_2$.

The low-transmittance layer 221 and high-transmittance layer 222 are preferably made of a material consisting of silicon and nitrogen. In the low-transmittance layer forming step of the method for manufacturing the mask blank, it is preferable that a silicon target is used to perform the reactive sputtering in the sputtering gas comprising the nitrogen gas and noble gas so as to form the low-transmittance layer 221. In the high-transmittance layer forming step, it is preferable that a silicon target is used to perform the reactive sputtering in a sputtering gas comprising the nitrogen gas and noble gas so as to form the high-transmittance layer 222.

As stated above, containing the transition metal in the low-transmittance layer 221 and high-transmittance layer 222 may be a factor for lowering the light fastness to the ArF exposure light. If the low-transmittance layer 221 and high-transmittance layer 222 contain any metal other than the transition metal or any metalloid element other than silicon, the optical properties may change as the contained metal or metalloid element moves between the low-transmittance layer 221 and high-transmittance layer 222. As for the non-metallic element, if the low-transmittance layer 221 and high-transmittance layer 222 contain oxygen, the transmittance to ArF exposure light is significantly reduced. In view of these aspects, the low-transmittance layer 221 and high-transmittance layer 222 are further preferably made of a material consisting of silicon and nitrogen. The noble gas is an element which is hardly detected even if a composition analysis, such as RBS or XPS, is conducted on the thin film. Thus, the above material consisting of silicon and nitrogen may be regarded as including a material containing a noble gas.

The phase-shift film 22 of the present embodiment comprises, at a location furthest from the transparent substrate, an uppermost layer 223 which is made of a material consisting of silicon, nitrogen, and oxygen, or a material consisting of silicon, nitrogen, oxygen, and one or more elements selected from metalloid elements, non-metallic elements, and noble gases. A silicon target, or a target made of a material consisting of silicon and one or more elements selected from metalloid elements and non-metallic elements is used to perform the sputtering in a sputtering gas comprising a noble gas, so as to form the uppermost layer 223 at the location furthest from the transparent substrate in the phase-shift film (uppermost layer forming step). Further, a silicon target may be used to perform the reactive sputtering in the sputtering gas comprising a nitrogen gas and a noble gas, so as to form the uppermost layer 223 at the location furthest from the transparent substrate in the phase-shift film and then perform a treatment for oxidizing at least a surface layer of the uppermost layer 223 (uppermost layer forming step).

The silicon-based material film which does not positively contain oxygen but contains nitrogen has high light fastness to the ArF exposure light, but has a lower chemical resistance than the silicon-based material film positively containing oxygen. If the mask blank comprises the high-transmittance layer 222 or low-transmittance layer 221, which does not positively contain oxygen but contains nitrogen, placed as an uppermost layer of the phase-shift film opposite from the transparent substrate, it is difficult to avoid oxidation of the surface layer of the phase-shift film due to mask cleaning or storage in the atmosphere for the phase-shift mask manufactured from the mask blank. If the surface layer of the phase-shift film is oxidized, the optical properties significantly change compared to the optical properties at the time of formation of the thin film. Especially when the low-transmittance layer 221 is provided as the uppermost layer of the phase-shift film, a degree of increase in transmittance due to the oxidation of the low-transmittance layer 221 becomes large. By configuring the phase-shift film to further comprise, on the laminated structure of the low-transmittance layer 221 and high-transmittance layer 222, the uppermost layer 223 made of a material consisting of silicon, nitrogen, and oxygen, or a material consisting of silicon, nitrogen, oxygen, and one or more elements selected from metalloid elements, non-metallic elements, and noble gases, the surface oxidation of the low-transmittance layer 221 and high-transmittance layer may be restrained.

The uppermost layer 223 made of a material consisting of silicon, nitrogen, and oxygen, or a material consisting of silicon, nitrogen, oxygen, and one or more elements selected from metalloid elements, non-metallic elements, and noble gases may include a configuration having substantially the same composition in a thickness direction of the layer, as well as a configuration with a compositional gradient in the thickness direction of the layer (a configuration having a compositional gradient in which the oxygen content in the uppermost layer 223 increases with distance from the transparent substrate 1). $SiO_2$ and SiON are suitable for the material for forming the uppermost layer 223 having substantially the same composition in the thickness direction of the layer. In the case of the uppermost layer 223 with a compositional gradient in the thickness direction of the layer, it is preferable that the transparent substrate 1 side is SiN, the oxygen content increases with distance from the transparent substrate 1, and the surface layer is $SiO_2$ o r SiON.

For the formation of the uppermost layer 223, the uppermost layer forming step may be applied, in which a silicon target, or a target made of a material consisting of silicon and one or more elements selected from metalloid elements and non-metallic elements is used to perform the reactive sputtering in the sputtering gas containing the nitrogen gas, oxygen gas, and noble gas so as to form the uppermost layer 223. The uppermost layer forming step may also be applied to the formation of the uppermost layer having substantially the same composition in the thickness direction of the layer, and the uppermost layer 223 with a compositional gradient. Also, for the formation of the uppermost layer 223, an uppermost layer forming step may be applied, in which a silicon dioxide ($SiO_2$) target, or a target made of a material containing, in addition to silicon dioxide ($SiO_2$), one or more elements selected from metalloid elements and non-metallic elements is used to perform the sputtering in the sputtering gas containing the noble gas so as to form the uppermost layer 223. This uppermost layer forming step may also be applied to the formation of the uppermost layer 223 having substantially the same composition in the thickness direction of the layer, and the uppermost layer 223 with a compositional gradient.

For the formation of the uppermost layer 223, an uppermost layer forming step may be applied, in which a silicon target, or a target made of a material containing, in addition to silicon, one or more elements selected from metalloid elements and non-metallic elements is used to perform the reactive sputtering in the sputtering gas containing the nitrogen gas and noble gas so as to form the uppermost layer 223 and further perform a treatment for oxidizing at least a surface layer of the uppermost layer 223. This uppermost layer forming step may be basically applied to the formation of the uppermost layer 223 with a compositional gradient in the thickness direction of the layer. In this case, the treatment for oxidizing the surface layer of the uppermost layer 223 may include a heat treatment in a gas containing oxygen, such as in the atmosphere, or a treatment for bringing ozone or oxygen plasma into contact with the uppermost layer 223.

While the low-transmittance layer 221, high-transmittance layer 222, and uppermost layer 223 in the phase-shift film 22 are formed by sputtering, any sputtering, such as DC sputtering, RF sputtering, and ion beam sputtering may be applied. When a target with low conductivity (a silicon target, a silicon compound target which contains no metalloid element or has a low content of metalloid element, etc.) is used, the RF sputtering or ion beam sputtering is preferably applied. However, RF sputtering is more preferably applied in view of film forming rate.

The transmittance to ArF exposure light of the phase-shift film 22 of the present embodiment is preferably 1% or more, and more preferably 2% or more, in order to effectively exhibit the phase-shift effect. The phase-shift film 22 is prepared such that the transmittance to ArF exposure light is preferably 30% or less, more preferably 20% or less, and further preferably 18% or less. The phase-shift film 22 is preferably prepared such that the phase difference between the ArF exposure light transmitted therethrough and the light traveling through air for the same distance as the thickness of the phase-shift film 22 is within a range of 150 to 180 degrees.

If NTD (Negative Tone Development) process is used as an exposure/development process for the resist film on the wafer, the bright field mask (transfer mask having a high pattern opening ratio) is used. In the bright field phase-shift mask, when the transmittance of the phase-shift film is higher, the balance between 0-order light and first order light for the light transmitted through a transparent portion is better, thereby improving a pattern resolution on the resist film. It is because there is a greater effect that the exposure light transmitted through the phase-shift film interferes with the 0-order light to attenuate the light intensity. When the phase-shift film 22 is applied to the bright field phase-shift mask, the transmittance at an exposure wavelength in the phase-shift film 22 is more preferably 10% or more. Also in this case, the transmittance at an exposure wavelength in the phase-shift film 22 is preferably 30% or less, and more preferably 20% or less.

If the phase-shift film 22 of the present embodiment is configured to have an optical property of transmittance (10% or more) suitable for the bright field phase-shift mask, the optical density with respect to the exposure light should still be 2.7 or more, and is preferably 3.0 or more, in the laminated structure of the phase-shift film 22, etching stopper film 3, and light-shielding film 4. In this case, since higher optical density is required of the light-shielding film 4, the effect obtained by applying the configuration of the light-shielding film 4 of the present embodiment becomes greater.

The process for manufacturing a phase-shift mask from the mask blank 102 of the present embodiment is similar to Embodiment 1 (in that the dry etching with the fluorine-based gas is performed, but the composition of the phase-shift film is different), and the method for manufacturing a semiconductor device using the phase-shift mask is also similar to Embodiment 1. Therefore, their explanations are omitted here.

EXAMPLES

Each embodiment of the present invention is described below in further detail based on examples.

Example 1

[Manufacture of Mask Blank]

A transparent substrate 1 having a main surface dimension of about 152 mm×about 152 mm and a thickness of about 6.35 mm and made of synthetic quartz glass was prepared. End faces and the main surface of the transparent substrate 1 were polished to have predetermined surface roughness, and then, the transparent substrate 1 was subjected to predetermined cleaning and drying processes.

Then, the transparent substrate 1 was placed in a single-wafer RF sputtering device, a mixed target of molybdenum (Mo) and silicon (Si) (Mo:Si=3 at %:97 at %) was used, and reactive sputtering (DC sputtering) in a mixed gas atmosphere of argon (Ar), nitrogen ($N_2$), and helium (He) was performed, such that the phase-shift film 2 made of molybdenum, silicon, and nitrogen (MoSiN film) and having a film thickness of 63 nm was formed on the transparent substrate 1.

Then, on the transparent substrate 1 with the phase-shift film 2 formed thereon, a heat treatment was performed so as to reduce film stress of the phase-shift film 2 and to form an oxidized layer on a surface layer. In particular, a heating furnace (electric furnace) was used to conduct the heat treatment at a heating temperature of 450° C. in the air for one hour. The phase-shift film 2 after the heat treatment was analyzed by STEM and EDX. As a result, it was found that the oxidized layer having a thickness of about 1.5 nm measured from the surface of the phase-shift film 2 was formed. For this phase-shift film 2, a spectroscopic ellipsometer (manufactured by J.A.Woollam; M-2000D) was used to measure the optical properties. As a result, at a wavelength of 193 nm, a refractive index n was 2.56, and the extinction coefficient k was 0.65. Also for the phase-shift film 2, the transmittance and phase difference at a wavelength of the ArF excimer laser light (193 nm) were measured by a phase-shift amount measuring device. As a result, the transmittance was 6.02%, and the phase difference was 177.7 degrees.

Then, the transparent substrate 1 was placed in the single-wafer DC sputtering device, a chromium (Cr) target was used, and the reactive sputtering (DC sputtering) in the mixed gas atmosphere of argon (Ar), nitrogen ($N_2$), carbon dioxide ($CO_2$), and helium (He) was conducted, such that the etching stopper film 3 made of chromium, oxygen, carbon, and nitrogen (CrOCN film: Cr: 48.9 at %, O: 26.4 at %, C: 10.6 at %, N: 14.1 at %) and having a film thickness of 5 nm was formed adjacent to the surface of the phase-shift film 2. The composition of the CrOCN film was obtained as a result from Auger electron spectroscopy (AES). The same can be said for the other films below.

Then, the transparent substrate 1 was placed in the single-wafer DC sputtering device, a mixed target of molybdenum (Mo) and silicon (Si) (Mo:Si=21 at % :79 at %) was used, and the reactive sputtering (DC sputtering) in a mixed gas atmosphere of argon (Ar) and helium (He) was performed, such that the lower layer of the light-shielding film 4, made of molybdenum and silicon (MoSi film: Mo: 20.3 at %, Si: 79.7 at %) and having a film thickness of 15 nm, was formed adjacent to the surface of the etching stopper film 3. Next, the transparent substrate 1 was placed in the single-wafer DC sputtering device, a mixed target of molybdenum (Mo) and silicon (Si) (Mo:Si=4 at %:96 at %) was used, and the reactive sputtering (DC sputtering) in a mixed gas atmosphere of argon (Ar), oxygen ($O_2$), nitrogen ($N_2$), and helium (He) was performed, such that the upper layer of the light-shielding film 4, made of molybdenum, silicon, oxygen, and nitrogen (MoSiON film: Mo: 2.6 at %, Si: 57.1 at %, 0:15.9 at %, N:24.4 at %) and having a film thickness of 10 nm, was formed adjacent to a surface of the lower layer of the light-shielding film 4. The total film thickness of the light-shielding film 4 was 25 nm.

For the laminated film comprised of the phase-shift film 2, etching stopper film 3, and light-shielding film 4 laminated on the transparent substrate 1, the spectroscopic ellipsometer (manufactured by J.A.Woollam: M-2000D) was used to measure optical density (OD) with respect to the light at a wavelength of 193 nm, and it was confirmed to be 3.03.

Then, the transparent substrate 1 was placed in the single-wafer DC sputtering device, a chromium (Cr) target was used, and the reactive sputtering (DC sputtering) in a mixed gas atmosphere of argon (Ar), nitrogen($N_2$), carbon dioxide ($CO_2$), and helium (He) was performed, such that the hard mask film 5 made of chromium, oxygen, carbon, and nitrogen (CrOCN film: Cr: 48.9 at %, O: 26.4 at %, C: 10.6 at %, N: 14.1 at %) and having a film thickness of 15 nm was formed adjacent to the surface of the light-shielding film 4. The predetermined cleaning process was further conducted, such that the mask blank 10 of Example 1 was obtained.

[Manufacture of Phase-Shift Mask]

Then, the mask blank 10 of Example 1 was used to manufacture the phase-shift mask 20 of Example 1 through the following procedure. First, the first resist film having a film thickness of 80 nm and made of a chemically amplified resist for electron beam drawing was formed adjacent to the surface of the hard mask film 5 through a spin coating method. Then, a first pattern was drawn with an electron beam on the first resist film, and the predetermined development and cleaning processes were conducted, such that a first resist film (first resist pattern) 6a having the first pattern was formed (FIG. 3(a)). The first pattern included, in a transfer pattern forming region (inner region of 132 mm x 104 mm), a transfer pattern of DRAM hp32 nm generation (a fine pattern including SRAF with a line width of 40 nm) to be formed in the phase-shift film 2, and further included the alignment mark pattern arranged in the region outside the transfer pattern forming region, where the light-shielding band is formed (region where the light-shielding film 4 is left upon the completion of the phase-shift mask).

Next, the dry etching with a mixed gas of chlorine and oxygen using the first resist pattern 6a as a mask was performed on the hard mask film 5, such that the hard mask film (hard mask film pattern) 5a having the first pattern was formed (FIG. 3(b)). After that, the first resist pattern 6a was removed.

Next, the dry etching with the fluorine-based gas ($CF_4$) using the hard mask film pattern 5a as a mask was performed on the light-shielding film 4, such that the light-shielding film (light-shielding film pattern) 4a having the first pattern was formed (FIG. 3(c)).

Next, the dry etching with the mixed gas of chlorine and oxygen using the light-shielding film pattern 4a as a mask was performed, such that the etching stopper film (etching stopper film pattern) 3a having the first pattern was formed (FIG. 3(d)). At this time, while the hard mask film pattern 5a was also etched from the surface with the mixed gas of chlorine and oxygen, it was left, having the thickness of about 5 nm.

Then, the second resist film having the film thickness of 80 nm and made of the chemically amplified resist for electron beam drawing was formed adjacent to the surface of the hard mask film pattern 5a through the spin coating method. Subsequently, the second pattern was drawn with the electron beam on the second resist film, and the predetermined development and cleaning processes were conducted, such that the second resist film (second resist pattern) 7b having the second pattern was formed. The second pattern comprises the light-shielding band pattern arranged in the region outside the transfer pattern forming region.

Next, the dry etching with the mixed gas of chlorine and oxygen using the second resist pattern 7b as a mask was performed, such that the hard mask film (hard mask film pattern) 5b having the second pattern and alignment mark pattern was formed (FIG. 3(e)). After that, the second resist pattern 7b was removed.

Then, the dry etching with the etching gas containing the fluorine-based gas ($SF_6$+He) using the etching stopper film pattern 3a as a mask was performed, such that the phase-shift film (phase-shift film pattern) 2a having the first pattern was formed. Further, at the same time, the hard mask film pattern 5b was used as a mask, so as to form the light-shielding film (light-shielding film pattern) 4b having the second pattern and alignment mark pattern (FIG. 3(f)).

Next, the dry etching with the mixed gas of chlorine and oxygen using the light-shielding film pattern 4b as a mask was performed, such that the etching stopper film (etching stopper film pattern) 3b having the second pattern and alignment mark pattern was formed. At the same time, the hard mask film pattern 5b was removed as a whole by this dry etching. After that, the predetermined cleaning was conducted, such that the phase-shift mask 20 was obtained (FIG. 3(g)).

[Verification Experiment for ArF Light Fastness]

A verification experiment for the ArF light fastness was conducted on the manufactured phase-shift mask 20 of Example 1. The ArF excimer laser was irradiated from the transparent substrate 1 side with respect to two portions on the phase-shift mask 20 of Example 1, in particular, the portion where only the phase-shift film pattern 2a existed within the transfer pattern forming region, and the portion where the phase-shift film pattern 2a, etching stopper film pattern 3b, and light-shielding film pattern 4b were laminated within a region wherein the light-shielding band was formed. The ArF excimer laser was irradiated intermittently, which was the condition close to the actual exposure by an exposure apparatus.

The specific conditions of the ArF excimer laser irradiation was as follows: emission frequency: 500 [Hz]; energy density per pulse: 10 [mJ/($cm^2$ ·pulse)]; the number of pulses sequentially emitted: 10; time required to sequentially emit 10 pulses: 20 [msec]; pulse width: 5 [nsec]; idle period after sequential emission (interval period): 500 [msec]. Under these irradiation conditions, intermittent irradiation was performed for 15 hours. An accumulated exposure amount for the thin film intermittently irradiated is 10 [kJ/$cm^2$]. During the ArF excimer laser irradiation, the phase-shift mask was placed in the atmosphere at a relative humidity of 35% RH.

Before and after the irradiation of the ArF excimer laser, the pattern width of the phase-shift film pattern 2a and the pattern width of the light-shielding film pattern 4b at the portion irradiated were measured to calculate an amount of change in line width before and after the ArF excimer laser irradiation. As a result, the amount of change in line width of the phase-shift film pattern 2a was 2.2 nm, and sufficiently high ArF light fastness could be confirmed. The amount of change in line width of the light-shielding film pattern 4a was 3.9 nm, and sufficiently high ArF light fastness could be also confirmed.

[Evaluation of Pattern Transfer Performance]

Using AIMS193 (manufactured by Carl Zeiss), a simulation of a transfer image in the exposure transfer to the resist film on a semiconductor device with the exposure light at the wavelength of 193 nm was performed on the phase-shift mask 20 of Example 1 after the verification experiment for the ArF light fastness. As a result of inspection of the transfer image exposed in this simulation, there was no short or disconnection in patterns, which satisfied the design specification sufficiently. From this result, a circuit pattern finally formed on the semiconductor device may have great accuracy, even if the phase-shift mask of Example 1 is set on the mask stage of the exposure apparatus to perform the exposure transfer to the resist film on the semiconductor device. Also, as for the contrast of the alignment mark, there was no misregistration between the phase-shift film pattern 2a, etching stopper film pattern 3b, and light-shielding film pattern 4b, and a high contrast with respect to the detection light from the alignment mark detector was obtained.

Example 2

[Manufacture of Mask Blank]

The transparent substrate 1 was prepared by a procedure similar to Example 1. Next, the transparent substrate 1 was placed in the single-wafer DC sputtering device, a mixed target of molybdenum (Mo) and silicon (Si) (Mo:Si=4 at % :96 at %) was used, and the reactive sputtering (RF sputtering) in the mixed gas atmosphere of argon (Ar), nitrogen ($N_2$), and helium (He) was conducted, such that the phase-shift film 2 made of molybdenum, silicon, and nitrogen (MoSiN film) and having a film thickness of 67 nm was formed on the transparent substrate 1.

Then, on the transparent substrate 1 with the phase-shift film 2 formed thereon, a heat treatment was performed so as to reduce film stress of the phase-shift film 2 and to form an oxidized layer on a surface layer. In particular, a heating furnace (electric furnace) was used to conduct the heat treatment at a heating temperature of 450° C. in the air for one hour. For the phase-shift film 2 after the heat treatment, the transmittance and phase difference at a wavelength of the ArF excimer laser light (about 193 nm) were measured by the phase-shift amount measuring device. As a result, the transmittance was 6.2%, and the phase difference was 179.5 degrees.

For the phase-shift film 2 after the heat treatment, the measurement was made by X-ray photoelectron spectroscopy (XPS). As a result, it was found that the oxidized layer (surface layer) having a thickness of about 2 nm measured from the surface of the phase-shift film 2 was formed. It was also found that the layers other than the surface layer in the phase-shift film 2 after the heat treatment were MoSiN (Mo:Si:N=1.8 at %:53.1 at %:45.1 at %).

In the X-ray photoelectron spectroscopy for the phase-shift film 2 of Example 2, montage spectrum was derived at each depth from the film surface. From the results of montage spectra, it was found that the phase-shift film 2 of Example 2 contained a relatively larger number of Mo—Si bonds than Mo—N bonds as the internal bonding states. In view of these results, the phase-shift film 2 of Example 2 is an incomplete nitride film.

Subsequently, the etching stopper film 3, light-shielding film 4, and hard mask film 5 were formed in said order adjacent to the surface of the phase-shift film 2 by a procedure similar to Example 1. The predetermined cleaning process was further conducted, such that the mask blank 10 of Example 2 was obtained. Before forming the hard mask film 5, the spectroscopic ellipsometer (manufactured by J.A.Woollam: M-2000D) was used with respect to the laminated film comprised of the phase-shift film 2, etching stopper film 3, and light-shielding film 4 laminated on the transparent substrate 1, so as to measure the optical density (OD) in relation to the light at a wavelength of 193 nm, and it was confirmed to be 3.01.

[Manufacture of Phase-Shift Mask]

The mask blank 10 of Example 2 was used to manufacture the phase-shift mask 20 of Example 2 through a procedure similar to Example 1.

[Verification Experiment for ArF Light Fastness]

A verification experiment for the ArF light fastness was conducted on the manufactured phase-shift mask 20 of Example 2 through a procedure similar to Example 1. As a result, the amount of change in line width of the phase-shift film pattern 2a before and after the irradiation of the ArF excimer laser was 2.7 nm, and sufficiently high ArF light fastness could be confirmed. The amount of change in line width of the light-shielding film pattern 4a before and after the irradiation of the ArF excimer laser was 3.9 nm, and sufficiently high ArF light fastness could also be confirmed.

[Evaluation of Pattern Transfer Performance]

Using AIMS193 (manufactured by Carl Zeiss), a simulation of a transfer image in the exposure transfer to the resist film on a semiconductor device with the exposure light at the wavelength of 193 nm was performed on the phase-shift mask 20 of Example 2 after the verification experiment for the ArF light fastness. As a result of inspection of the transfer image exposed in this simulation, there was no short or disconnection in patterns, which satisfied the design specification sufficiently. From this result, a circuit pattern finally formed on the semiconductor device may have great accuracy, even if the phase-shift mask of Example 2 is set on the mask stage of the exposure apparatus to perform the exposure transfer to the resist film on the semiconductor device. Also, as for the contrast of the alignment mark, there was no misregistration between the phase-shift film pattern 2a, etching stopper film pattern 3b, and light-shielding film pattern 4b, and a high contrast with respect to the detection light from the alignment mark detector was obtained.

Example 3

[Manufacture of Mask Blank]

The transparent substrate 1 was prepared by a procedure similar to Example 1. Next, the transparent substrate 1 was placed in the single-wafer RF sputtering device, a silicon (Si) target was used, and the reactive sputtering (RF sputtering) using the mixed gas of argon (Ar) and nitrogen ($N_2$) (flow ratio: Ar:$N_2$=2:3, pressure=0.035 Pa) as a sputtering gas at a power of RF power supply of 2.8 kW was conducted, such that the low-transmittance layer 221 made of silicon and nitrogen (Si:N=59 at %:41 at %) and having a thickness of 12 nm was formed on the transparent substrate 1.

Only the low-transmittance layer 221 was formed on a main surface of another transparent substrate under the same conditions, and the spectroscopic ellipsometer (manufactured by J.A.Woollam: M-2000D) was used to measure the optical properties of this low-transmittance layer 221. As a result, at a wavelength of 193 nm, the refractive index n was 1.85, and the extinction coefficient k was 1.70. As for the conditions used to form the low-transmittance layer 221, the film forming conditions such as a flow ratio at which the film may be stably formed in the area of metal mode was selected after the verification of a relationship between a flow ratio of $N_2$ gas in the mixed gas of Ar gas and $N_2$ gas as the sputtering gas and a deposition rate by the single-wafer RF sputtering device used. The composition of the low-transmittance layer 221 was obtained as a result from the measurement by X-ray photoelectron spectroscopy (XPS). The same can be said for the other films below.

Next, the transparent substrate 1 with the low-transmittance layer 221 laminated was placed in the single-wafer RF sputtering device, a silicon (Si) target was used, and the reactive sputtering (RF sputtering) using the mixed gas of argon (Ar) and nitrogen ($N_2$) (flow ratio: Ar:$N_2$=1:3, pressure=0.09 Pa) as a sputtering gas at a power of RF power supply of 2.8 kW was conducted, such that the high-transmittance layer 222 made of silicon and nitrogen (Si:N=46 at % :54 at %) and having a thickness of 55 nm was formed on the low-transmittance layer 221. Only the high-transmittance layer 222 was formed on a main surface of another transparent substrate under the same conditions, and the spectroscopic ellipsometer (manufactured by J.A.Woollam: M-2000D) was used to measure the optical properties of this high-transmittance layer 222. As a result, at a wavelength of 193 nm, the refractive index n was 2.52, and the extinction coefficient k was 0.39. As for the conditions used to form the high-transmittance layer 222, the film forming conditions such as a flow ratio at which the film may be stably formed in the area of reactive mode (poison mode) was selected after the verification of a relationship between a flow ratio of $N_2$ gas in the mixed gas of Ar gas and $N_2$ gas as the sputtering gas and a deposition rate by the single-wafer RF sputtering device used.

Next, the transparent substrate 1 with the low-transmittance layer 221 and high-transmittance layer 222 laminated was placed in the single-wafer RF sputtering device, a silicon (Si) target was used, and the reactive sputtering (RF sputtering) using the mixed gas of argon (Ar) and nitrogen ($N_2$) (flow ratio: Ar:$N_2$=1:3, pressure=0.09 Pa) as a sputtering gas at a power of RF power supply of 2.8 kW was conducted, such that the uppermost layer 223 having a thickness of 4 nm was formed on the high-transmittance layer 222. Further, the oxidation treatment using ozone was conducted on the uppermost layer 223, such that an oxidized layer was formed on a surface layer of the uppermost layer 223. Thus, the uppermost layer 223 became a compositional gradient film which had the oxygen content increasing with distance from the transparent substrate 1.

Through the above procedure, the phase-shift film 2 comprised of the low-transmittance layer 221, high-transmittance layer 222, and uppermost layer 223 was formed on the transparent substrate 1. For the phase-shift film 2, the transmittance and phase difference at a wavelength of the ArF excimer laser light (about 193 nm) were measured by the phase-shift amount measuring device. As a result, the transmittance was 5.97%, and the phase difference was 177.7 degrees.

Then, the etching stopper film 3, light-shielding film 4, and hard mask film 5 were formed in said order adjacent to the surface of the phase-shift film 2 by a procedure similar to Example 1. The predetermined cleaning process was further conducted, such that the mask blank 102 of Example 3 was obtained. Before forming the hard mask film 5, the spectroscopic ellipsometer (manufactured by J.A.Woollam: M-2000D) was used for the laminated film comprised of the phase-shift film 2, etching stopper film 3, and light-shielding film 4 laminated on the transparent substrate 1, so as to measure the optical density (OD) in relation to the light at a wavelength of 193 nm, and it was confirmed to be 3.06.

[Manufacture of Phase-Shift Mask]

The mask blank 102 of Example 3 was used to manufacture the phase-shift mask 20 of Example 3 through a procedure similar to Example 1.

[Verification Experiment for ArF Light Fastness]

A verification experiment for the ArF light fastness was conducted on the manufactured phase-shift mask 20 of Example 3 through a procedure similar to Example 1. As a result, the amount of change in line width of the phase-shift film pattern 2a before and after the irradiation of the ArF excimer laser was 1.0 nm, and sufficiently high ArF light fastness could be confirmed. The amount of change in line width of the light-shielding film pattern 4a before and after the irradiation of the ArF excimer laser was 3.9 nm, and sufficiently high ArF light fastness could also be confirmed.

[Evaluation of Pattern Transfer Performance]

Using AIMS193 (manufactured by Carl Zeiss), a simulation of a transfer image in the exposure transfer to the resist film on a semiconductor device with the exposure light at the wavelength of 193 nm was performed on the phase-shift mask 20 of Example 3 after the verification experiment for the ArF light fastness. As a result of inspection of the transfer image exposed in this simulation, there was no short or disconnection in patterns, which satisfied the design specification sufficiently. From this result, a circuit pattern finally formed on the semiconductor device may have great accuracy, even if the phase-shift mask of Example 3 is set on the mask stage of the exposure apparatus to perform the exposure transfer to the resist film on the semiconductor device. Also, as for the contrast of the alignment mark, there was no misregistration between the phase-shift film pattern 2a, etching stopper film pattern 3b, and light-shielding film pattern 4b, and a high contrast with respect to the detection light from the alignment mark detector was obtained.

REFERENCE NUMERALS

1: transparent substrate
2, 22: phase-shift film
2a: phase-shift film pattern
3: etching stopper film
3a, 3b: etching stopper film pattern
4: light-shielding film
4a, 4b: light-shielding film pattern
5: hard mask film
5a, 5b: hard mask film pattern
6a: first resist pattern
7b: second resist pattern
10, 102: mask blank
20: phase-shift mask
221: low-transmittance layer
222: high-transmittance layer
223: uppermost layer (surface layer)

What is claimed is:

1. A mask blank having a structure in which a phase-shift film, an etching stopper film, a light-shielding film, and a hard mask film are laminated in said order on a transparent substrate, wherein the hard mask film is made of a material containing chromium;

wherein the phase-shift film is made of a material in which transition metal, silicon, and nitrogen are contained, and a ratio of the content [atom %] of transition metal to the total content [atom %] of transition metal and silicon is less than 4 [%];

wherein the light-shielding film has a single layer structure, or a laminated structure comprised of multiple layers; and wherein at least one layer in the light-shielding film is made of a material which contains transition metal and silicon, but does not contain nitrogen and oxygen, or a material which contains transition metal, silicon, and nitrogen, and satisfies the conditions of Formula (1) below:

$$C_N \leq 9.0 \times 10^{-6} \times R_M^4 - 1.65 \times 10^{-4} \times R_M^3 - 7.718 \times 10^{-2} \times R_M^2 + 3.611 \times R_M - 21.084 \qquad \text{Formula (1)}$$

wherein $R_M$ is a ratio [%] of the content [atom %] of transition metal to the total content [atom %] of transition metal and silicon in said one layer, and $C_N$ [atom %] is the content [atom %] of nitrogen in said one layer.

2. The mask blank according to claim 1, wherein the phase-shift film has a function of transmitting ArF excimer laser light at a transmittance of 1% or more and 30% or less.

3. The mask blank according to claim 1, wherein the optical density with respect to ArF excimer laser light is 2.7 or more in the laminated structure of the phase-shift film, the etching stopper film, and the light-shielding film.

4. A phase-shift mask manufactured from the mask blank according to claim 1.

5. A method for manufacturing a semiconductor device, comprising the step of:

setting the phase-shift mask according to claim 4 on an exposure apparatus having an exposure light source for emitting ArF excimer laser light, so as to transfer a transfer pattern onto a resist film formed on a transfer target substrate.

6. A mask blank having a structure in which a phase-shift film, an etching stopper film, a light-shielding film, and a hard mask film are laminated in said order on a transparent substrate, wherein the hard mask film is made of a material containing chromium;

wherein the phase-shift film is comprised of a surface layer and layers other than the surface layer;

wherein the layers other than the surface layer are made of a material in which transition metal, silicon, and nitrogen are contained, a ratio of the content [atom %] of transition metal to the total content [atom %] of transition metal and silicon is less than 9 [%], and the material is incomplete nitride;

wherein the light-shielding film has a single layer structure, or a laminated structure comprised of multiple layers; and wherein at least one layer in the light-shielding film is made of a material which contains transition metal and silicon, but does not contain nitrogen and oxygen, or a material which contains transition metal, silicon, and nitrogen, and satisfies the conditions of Formula (1) below:

$$C_N \leq 9.0 \times 10^{-6} \times R_M^4 - 1.65 \times 10^{-4} \times R_M^3 - 7.718 \times 10^2 \times R_M^2 + 3.611 \times R_M - 21.084 \qquad \text{Formula (1)}$$

wherein $R_M$ is a ratio [%] of the content [atom %] of transition metal to the total content [atom %] of transition metal and silicon in said one layer, and $C_N$ [atom %] is the content [atom %] of nitrogen in said one layer.

7. The mask blank according to claim 6, wherein the phase-shift film has a function of transmitting ArF excimer laser light at a transmittance of 4% or more and 9% or less.

8. The mask blank according to claim 6, wherein the optical density with respect to ArF excimer laser light is 2.7 or more in the laminated structure of the phase-shift film, the etching stopper film, and the light-shielding film.

9. A phase-shift mask manufactured from the mask blank according to claim 6.

10. A method for manufacturing a semiconductor device, comprising the step of:
    setting the phase-shift mask according to claim 9 on an exposure apparatus having an exposure light source for emitting ArF excimer laser light, so as to transfer a transfer pattern onto a resist film formed on a transfer target substrate.

11. A mask blank having a structure in which a phase-shift film, an etching stopper film, a light-shielding film, and a hard mask film are laminated in said order on a transparent substrate,
    wherein the hard mask film is made of a material containing chromium;
    wherein the phase-shift film is comprised of a surface layer and layers other than the surface layer;
    wherein the layers other than the surface layer are made of a material consisting of silicon and nitrogen, or a material consisting of silicon, nitrogen, and one or more elements selected from metalloid elements, non-metallic elements, and noble gases;
    wherein the surface layer of the phase-shift film is made of a material consisting of silicon, nitrogen, and oxygen, or a material consisting of silicon, nitrogen, oxygen, and one or more elements selected from metalloid elements, non-metallic elements, and noble gases;
    wherein the light-shielding film has a single layer structure, or a laminated structure comprised of multiple layers; and
    wherein at least one layer in the light-shielding film is made of a material which contains transition metal and silicon, but does not contain nitrogen and oxygen, or a material which contains transition metal, silicon, and nitrogen, and satisfies the conditions of Formula (1) below:

$$C_N \leq 9.0 \times 10^{-6} \times R_M^4 - 1.65 \times 10^{-4} \times R_M^3 + 7.718 \times 10^2 \times R_M^2 + 3.611 \times R_M - 21.084 \quad \text{Formula (1)}$$

wherein $R_M$ is a ratio [%] of the content [atom %] of transition metal to the total content [atom %] of transition metal and silicon in said one layer, and $C_N$ [atom %] is the content [atom %] of nitrogen in said one layer.

12. The mask blank according to claim 11, wherein the phase-shift film has a function of transmitting ArF excimer laser light at a transmittance of 1% or more and 30% or less.

13. The mask blank according to claim 11, wherein the layers other than the surface layer in the phase-shift film have a structure in which a low-transmittance layer and a high-transmittance layer are laminated, and
    wherein the low-transmittance layer has nitrogen content that is relatively lower than the high-transmittance layer.

14. The mask blank according to claim 11, wherein the optical density with respect to ArF excimer laser light is 2.7 or more in the laminated structure of the phase-shift film, the etching stopper film, and the light-shielding film.

15. A phase-shift mask manufactured from the mask blank according to claim 11.

16. A method for manufacturing a semiconductor device, comprising the step of:
    setting the phase-shift mask according to claim 15 on an exposure apparatus having an exposure light source for emitting ArF excimer laser light, so as to transfer a transfer pattern onto a resist film formed on a transfer target substrate.

* * * * *